(12) United States Patent
Kim et al.

(10) Patent No.: US 9,153,499 B2
(45) Date of Patent: Oct. 6, 2015

(54) SEMICONDUCTOR DEVICE HAVING METAL PLUG AND METHOD OF FORMING THE SAME

(75) Inventors: Wan-Don Kim, Yongin-si (KR);
Seung-Hwan Lee, Suwon-si (KR);
Beom-Seok Kim, Suwon-si (KR);
Kyu-Ho Cho, Hwaseong-si (KR);
Oh-Seong Kwon, Hwaseong-si (KR);
Geun-Kyu Choi, Hwaseong-si (KR);
Ji-Eun Lim, Yongin-si (KR); Yong-Suk Tak, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 613 days.

(21) Appl. No.: 13/425,906

(22) Filed: Mar. 21, 2012

(65) Prior Publication Data
US 2012/0299072 A1    Nov. 29, 2012

(30) Foreign Application Priority Data

May 24, 2011    (KR) .................. 10-2011-0049090

(51) Int. Cl.
*H01L 27/06* (2006.01)
*H01L 21/8234* (2006.01)
(52) U.S. Cl.
CPC *H01L 21/823475* (2013.01); *H01L 21/823456* (2013.01)
(58) Field of Classification Search
None
See application file for complete search history.

(56) References Cited

U.S. PATENT DOCUMENTS

| 5,327,011 | A  | * | 7/1994  | Iwamatsu ............. 257/750 |
| 6,500,763 | B2 |   | 12/2002 | Kim et al. |
| 6,667,209 | B2 |   | 12/2003 | Won et al. |
| 6,699,769 | B2 |   | 3/2004  | Song et al. |
| 6,884,673 | B2 |   | 4/2005  | Joo et al. |
| 7,427,537 | B2 | * | 9/2008  | Tokunaga et al. ....... 438/128 |
| 7,781,819 | B2 |   | 8/2010  | Kim et al. |
| 2005/0161727 | A1 | | 7/2005 | Joo et al. |
| 2008/0283815 | A1 | * | 11/2008 | Nejad .................. 257/4 |

FOREIGN PATENT DOCUMENTS

| KR | 1020010056241 | 7/2001 |
| KR | 1020020091663 | 12/2002 |
| KR | 1020030067821 | 8/2003 |
| KR | 1020030084350 | 11/2003 |

* cited by examiner

*Primary Examiner* — Matthew W Such
*Assistant Examiner* — Robert Carpenter
(74) *Attorney, Agent, or Firm* — F. Chau & Associates, LLC

(57) ABSTRACT

Provided is a semiconductor device including first, second and third source/drain regions. A first conductive plug in contact with the first source/drain regions, having a first width and a first height, and including a first material is provided. An interlayer insulating layer covering the first conductive plug and the substrate is disposed. A second conductive plug vertically penetrating the interlayer insulating layer to be in contact with the second source/drain regions, having a second width and a second height, and including a second material is provided. A third conductive plug vertically penetrating the interlayer insulating layer to be in contact with the third source/drain regions, having a third width and a third height, and including a third material is disposed. The second material includes a noble metal, a noble metal oxide or a perovskite-based conductive oxide.

18 Claims, 30 Drawing Sheets

SEMICONDUCTOR DEVICE HAVING METAL PLUG AND METHOD OF FORMING THE SAME

CROSS-REFERENCE TO RELATED APPLICATION

This application claims priority under 35 U.S.C. §119 to Korean Patent Application No. 10-2011-0049090 filed on May 24, 2011, the disclosure of which is herein incorporated by reference in its entirety.

TECHNICAL FIELD

Embodiments of the inventive concept relate to a semiconductor device having a metal plug and a method of forming the semiconductor device.

DISCUSSION OF RELATED ART

Much effort has been devoted to improving current drivability of a buried contact plug and a lower electrode, and reducing leakage current in a dynamic random access memory (DRAM).

SUMMARY

Embodiments of the inventive concept provide a semiconductor device that can prevent degradation of a contact plug and a lower electrode and improve electrical properties, and a method of forming the semiconductor device.

In accordance with an embodiment of the inventive concept, a semiconductor device is provided. The semiconductor device includes a substrate including first source/drain regions, second source/drain regions and third source/drain regions. A first conductive plug in contact with the first source/drain regions, having a first width and a first height, and including a first material is provided. An interlayer insulating layer covering the first conductive plug and the substrate is disposed. A second conductive plug vertically penetrating the interlayer insulating layer to be in contact with the second source/drain regions, having a second width and a second height, and including a second material is provided. A third conductive plug vertically penetrating the interlayer insulating layer to be in contact with the third source/drain regions, having a third width and a third height, and including a third material is disposed. The second material is formed of a noble metal, a noble metal oxide or a perovskite-based conductive oxide According to an embodiment, the first material may include silicon. The second material may include Pt, Ru, Ir, PtO, $RuO_2$, $IrO_2$, $SrRuO_3$, $BaRuO_3$, $CaRuO_3$, $(Ba,Sr)RuO_3$ or $La(Sr,Co)O_3$. The third material may include copper, aluminum or tungsten.

According to an embodiment, the third width may be greater than the second width.

According to an embodiment, a lower electrode connected to the second conductive plug may be formed on the interlayer insulating layer. A capacitor dielectric layer may be formed on the lower electrode. An upper electrode may be formed on the capacitor dielectric layer. The lower electrode may be formed of the second material. The lower electrode may be in continuity with the second conductive plug. The lower electrode may include a first lower electrode having a first horizontal thickness, and a second lower electrode having a second horizontal thickness. The first horizontal thickness may be different from the second horizontal thickness.

According to an embodiment, a metal interconnection may be formed on the third conductive plug. The lower electrode may be formed at the same level as the metal interconnection.

According to an embodiment, a gate electrode may be formed adjacent to the third source/drain regions on the substrate. The gate electrode may include a lower gate electrode and an upper gate electrode. The lower gate electrode has the same or substantially the same surface height as the first conductive plug. The lower gate electrode may be formed of polysilicon.

According to an embodiment, a first conductive interconnection may be formed on the first conductive plug. The first conductive interconnection may be formed at the same or substantially the same level as the upper gate electrode.

According to an embodiment, the second height may be greater than the first height, and the third height may be greater than the second height.

A cell gate electrode may be formed between the first source/drain electrodes and the second source/drain electrodes.

According to an embodiment of the inventive concept, a semiconductor device is provided. The semiconductor device includes a substrate including first source/drain regions, second source/drain regions and third source/drain regions. A bit plug in contact with the first source/drain regions, having a first width and a first height, and including a first material is provided. An interlayer insulating layer covering the bit plug and the substrate is disposed. A buried contact plug vertically penetrating the interlayer insulating layer to be in contact with the second source/drain regions, having a second width and a second height, and including a second material is disposed. A peripheral plug vertically penetrating the interlayer insulating layer to be in contact with the third source/drain regions, having a third width and a third height, and including a third material is disposed. A lower electrode formed on the interlayer insulating layer and connected to the buried contact plug is disposed. A supporter in contact with a sidewall of the lower electrode is disposed. A capacitor dielectric layer is disposed on the lower electrode. An upper electrode is disposed on the capacitor dielectric layer. The third width is greater than the second width. The lower electrode includes the second material. The buried contact plug and the lower electrode include an integrally-formed structure. The second material is formed of a noble metal, a noble metal oxide or a perovskite-based conductive oxide.

According to an embodiment, the lower electrode may include a first lower electrode on the buried contact plug, and a second lower electrode on the first lower electrode. The first lower electrode may have a different width from the second lower electrode. The supporter may include a first supporter in contact with the first lower electrode, and a second supporter in contact with the second lower electrode.

An embodiment of the inventive concept provides a method of forming a semiconductor device. The method includes forming a lower conductive pattern on a substrate. An interlayer insulating layer having a contact hole is formed on the substrate. The lower conductive pattern is exposed in the contact hole. A preliminary plug is formed in the contact hole. The substrate having the preliminary plug is exposed to a temperature between about 600° C. and about 1150° C. The preliminary plug is removed. A buried contact plug is formed in the contact hole.

According to an embodiment, before forming the buried contact plug, a peripheral contact hole penetrating the interlayer insulating layer may be formed. Impurities may be implanted into the substrate through the peripheral contact hole. For the purpose of activating the impurities, an thermal process in which the substrate is exposed to a temperature between about 600° C. and about 1150° C. may be performed. A peripheral plug may be formed in the peripheral contact hole.

An embodiment of the inventive concept provides a method of forming a semiconductor device. The method includes forming a plurality of lower conductive patterns on a substrate. An interlayer insulating layer having contact holes is formed on the substrate. The lower conductive patterns are exposed in the contact holes. Preliminary plugs are formed in the contact holes. A first mold layer is formed on the interlayer insulating layer and the preliminary plugs. First capacitor holes penetrating the first mold layer to expose the preliminary plugs are formed. First preliminary electrodes are formed in the first capacitor holes. A second mold layer is formed on the first mold layer. A support layer is formed on the second mold layer. Second capacitor holes penetrating the support layer and the second mold layer to expose the first preliminary electrodes are formed. Second preliminary electrodes are formed in the second capacitor holes. The support layer is patterned to form a supporter. The second preliminary electrodes, the first preliminary electrodes, and the preliminary plugs are removed. Buried contact plugs are formed in the contact holes, first lower electrodes are formed in the first capacitor holes, and second lower electrodes are formed in the second capacitor holes. Before removing the preliminary plugs, an thermal process in which the substrate having the preliminary plugs is exposed to a temperature between about 600° C. and about 1150° C. is performed.

An embodiment of the inventive concept further provides a method of forming a semiconductor device. The method includes forming a plurality of lower conductive patterns on the substrate. An interlayer insulating layer having contact holes is formed on the substrate. The lower conductive patterns are exposed in the contact holes. Preliminary plugs are formed in the contact holes. A first mold layer is formed on the interlayer insulating layer and the preliminary plugs. A first support layer is formed on the first mold layer. First capacitor holes penetrating the first support layer and the first mold layer to expose the preliminary plugs are formed. First preliminary electrodes are formed in the first capacitor holes. The first support layer is patterned to form a first supporter. A second mold layer is formed on the first mold layer. A second support layer is formed on the second mold layer. Second capacitor holes penetrating the second support layer and the second mold layer to expose the first preliminary electrodes are formed. The first preliminary electrodes and the preliminary plugs are simultaneously removed in the second capacitor holes. Buried contact plugs are formed in the contact holes, first lower electrodes are formed in the first capacitor holes, and second lower electrodes are formed in the second capacitor holes. Before removing the preliminary plugs, an thermal process in which the substrate having the preliminary plugs is exposed to a temperature between about 600° C. and about 1150° C. may be performed. The second support layer formed on the second mold layer may be patterned to form a second supporter.

BRIEF DESCRIPTION OF THE DRAWINGS

The embodiments of the inventive concepts will be apparent from the detailed description with reference to the accompanying drawings.

DETAILED DESCRIPTION OF THE EMBODIMENTS

Figure 1:
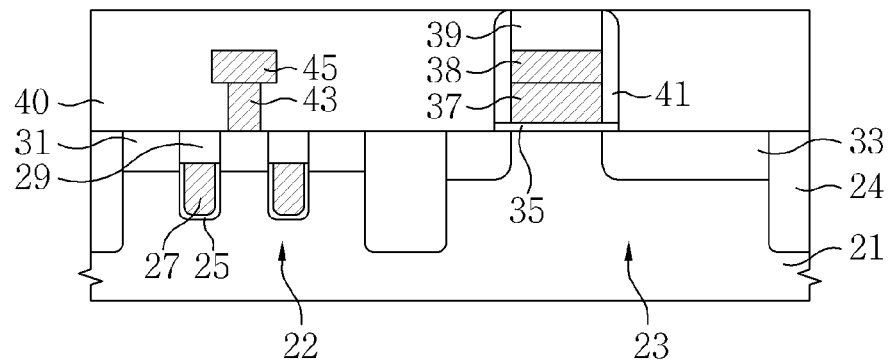
FIGS. 1 to 11E are cross-sectional views illustrating a method of forming a semiconductor device and devices related to the semiconductor device according to an embodiment of the inventive concept.

Various embodiments will now be described more fully with reference to the accompanying. This inventive concept may, however, be embodied in different forms and should not be construed as limited to the embodiments set forth herein. In the drawings, the thickness of layers and regions may be exaggerated for clarity. Also, when a layer is referred to as "on" another layer or a substrate, it may be directly formed on another layer or the substrate or a third layer may be interposed therebetween. Like reference numerals may designate like or similar elements throughout the specification and the drawings.

As used herein, the singular forms "a," "an" and "the" are intended to include the plural forms as well, unless the context clearly indicates otherwise.

FIGS. 1 to 11E are cross-sectional views illustrating a method of forming a semiconductor device and devices related to the semiconductor device according to an embodiment of the inventive concept.

Referring to FIG. 1, an isolation layer 24 defining a first active region 22 and a second active region 23 may be formed in a semiconductor substrate 21. A cell gate dielectric layer 25, a cell gate electrode 27, a cell gate capping pattern 29 and cell source/drain regions 31 may be formed in the first active region 22. A peripheral gate dielectric layer 35, peripheral gate electrodes 37 and 38, a peripheral gate capping pattern 39, a gate spacer 41, and peripheral source/drain regions 33 may be formed in the second active region 23. The peripheral gate electrodes 37 and 38 may include a lower gate electrode 37 and an upper gate electrode 38. An interlayer insulating layer 40 covering the entire top surface of the semiconductor substrate 21 may be formed. A bit plug 43 and a bit line 45 may be formed in the interlayer insulating layer 40. The bit plug 43 may contact one selected from the cell source/drain regions 31.

The bit plug 43 and the bit line 45 may be formed of a conductive material such as polysilicon, metals, metal silicide or a combination thereof. The interlayer insulating layer 40 may be formed of an insulating layer such as silicon oxide, silicon nitride, silicon oxynitride or a combination thereof. According to an embodiment, the interlayer insulating layer 40 may include multiple layers.

According to an embodiment, the bit plug 43 and the lower gate electrode 37 may be formed of the same material. The bit plug 43 and the lower gate electrode 37 may be formed of silicon such as polysilicon. The bit plug 43 may have a surface height the same or substantially the same as a surface height of the lower gate electrode 37. The bit line 45 and the upper gate electrode 38 may be formed of the same material. The bit line 45 and the upper gate electrode 38 may be formed at the same level.

Figure 2:
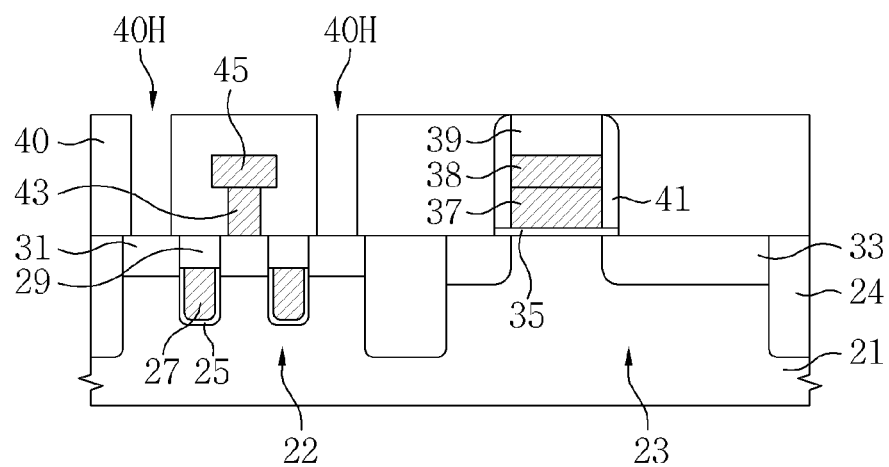
Figure 3:
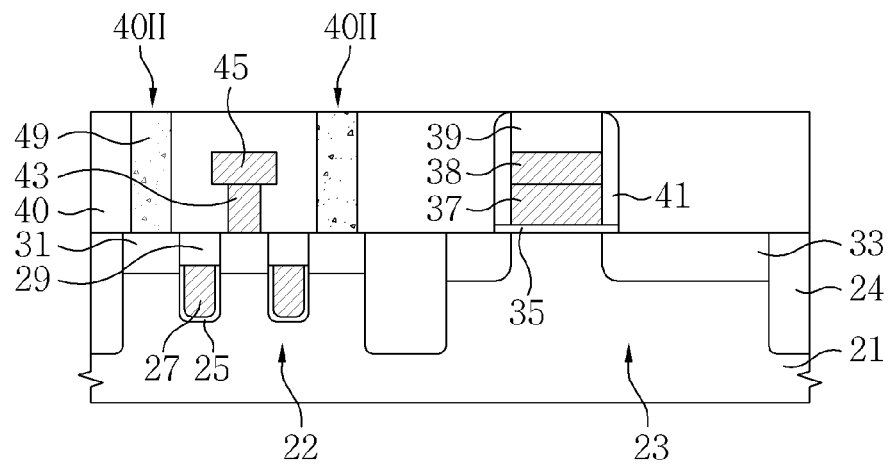

Referring to FIGS. 2 and 3, a plurality of contact holes 40H penetrating the interlayer insulating layer 40 and exposing the cell source/drain regions 31 may be formed. According to an embodiment, the contact holes 40H may be buried contact holes electrically connecting the cell source/drain regions 31 to a storage electrode.

Preliminary plugs 49 may be formed in the contact holes 40H. The preliminary plugs 49 may be formed of a material having an etch selectivity with respect to the interlayer insulating layer 40 and exhibiting high thermal stability. For example, the preliminary plugs 49 may be formed of polysilicon, a metal, a barrier material or a combination thereof. The barrier material may include Ti, TiN, TiAlN, TiSiN, TaN, TaAlN, TaSiN or a combination thereof. According to an embodiment, the preliminary plugs 49 may be formed of tungsten (W) and a barrier material may surround a sidewall and bottom of each preliminary plug 49. According to an embodiment, the preliminary plugs 49 may be formed of an insulating material having an etch selectivity with respect to the interlayer insulating layer 40. For example, the preliminary plugs 49 may be formed of a spin on hardmask (SOH) layer.

The preliminary plugs 49 may completely fill the contact holes 40H. The interlayer insulating layer 40 and the preliminary plugs 49 may include planarized top surfaces. For example, the interlayer insulating layer 40 and the preliminary plugs 49 may be exposed on the same planar surface.

Figure 4:
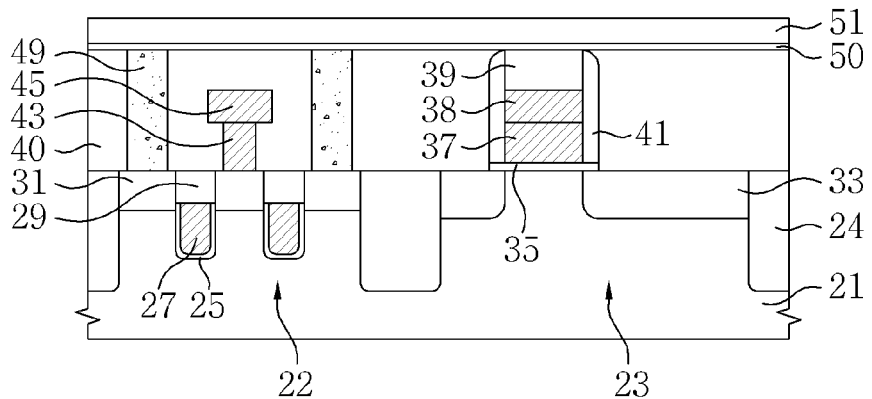
Figure 5:
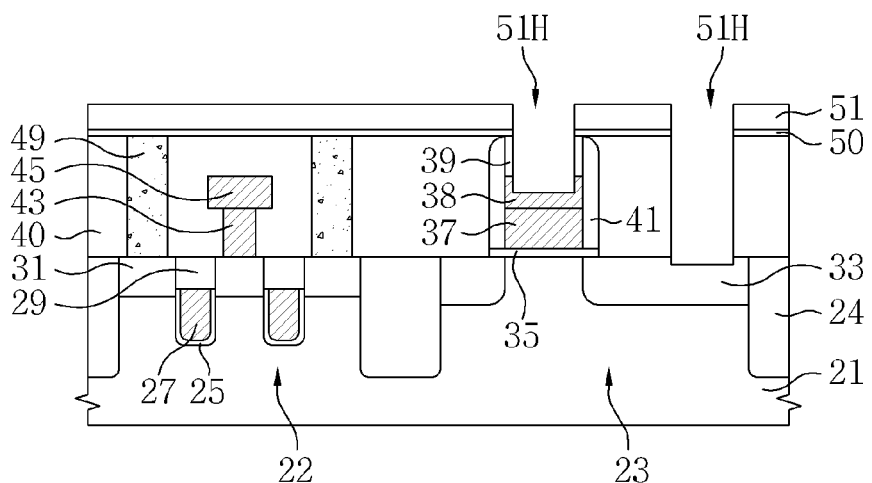

Referring to FIGS. 4 and 5, a first etch stop layer 50 and an upper insulating layer 51 covering the entire top surface of the semiconductor substrate 21 may be sequentially stacked. The upper insulating layer 51, the first etch stop layer 50, and the interlayer insulating layer 40 may be patterned to form peripheral contact holes 51H. A peripheral contact hole 51H selected from the peripheral contact holes 51H may penetrate the upper insulating layer 51, the first etch stop layer 50 and the interlayer insulating layer 40 to expose a corresponding peripheral source/drain region of the peripheral source/drain regions 33. Another peripheral contact hole 51H selected from the peripheral contact holes 51H may penetrate the upper insulating layer 51, the first etch stop layer 50, the interlayer insulating layer 40 and the peripheral gate capping pattern 39 to expose the upper gate electrode 38. The upper insulating layer 51 and the first etch stop layer 50 may cover the preliminary plugs 49.

Figure 6:
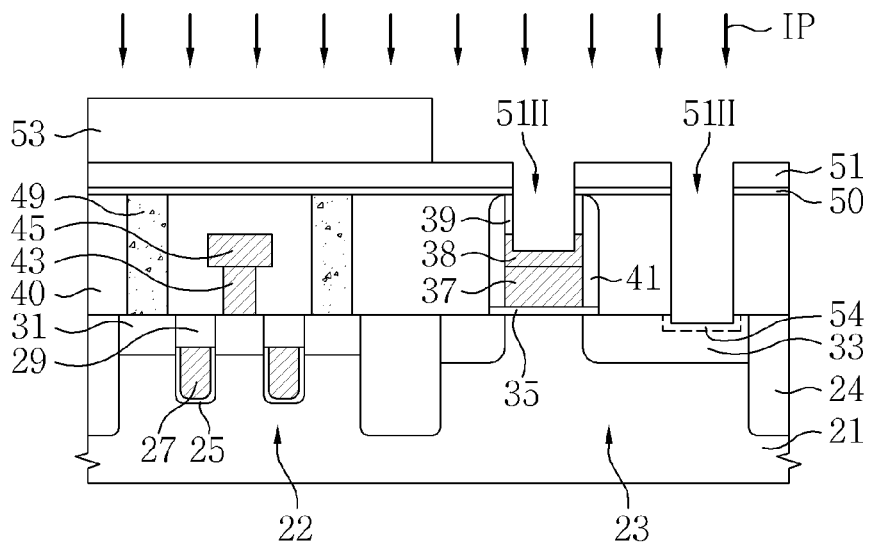

Referring to FIG. 6, an ion implantation mask 53 covering the preliminary plugs 49 and exposing the peripheral contact holes 51H may be formed on the upper insulating layer 51. An ion implantation process IP may be performed to dope impurities into the peripheral source/drain regions 33 via peripheral contact holes 51H, so that a plug impurity region 54 may be formed in the peripheral source/drain regions 33. While the plug impurity region 54 is formed, impurities may be implanted into the upper gate electrode 38 via the peripheral contact holes 51H. The ion implantation mask 53 may prevent implantation of impurities into the preliminary plugs 49 during the ion implantation process IP.

According to an embodiment, the peripheral source/drain regions 33 may include impurities exhibiting the same conductivity type as the plug impurity region 54. For example, when the peripheral source/drain regions 33 include p-type impurities, the plug impurity region 54 may include a higher concentration of p-type impurities than the peripheral source/drain regions 33. Alternatively, when the peripheral source/drain regions 33 include n-type impurities, the plug impurity region 54 may include a higher concentration of n-type impurities than the peripheral source/drain regions 33. The p-type impurities may include boron (B), and the n-type impurities may include arsenic (As) or phosphorus (P).

According to an embodiment, a first group of the peripheral source/drain regions 33 may include p-type impurities, and a second group of the peripheral source/drain regions 33 may include n-type impurities. According to an embodiment, forming the ion implantation mask 53 and performing the ion implantation process IP may include forming a first ion implantation mask covering the preliminary plugs 49 and the first group of the peripheral source/drain regions 33 and performing a first ion implantation process to implant n-type impurities into the second group of the peripheral source/drain regions 33, and forming a second ion implantation mask covering the preliminary plugs 49 and the second group of the peripheral source/drain regions 33 and performing a second ion implantation process to implant p-type impurities into the first group of the peripheral source/drain regions 33.

Figure 7:
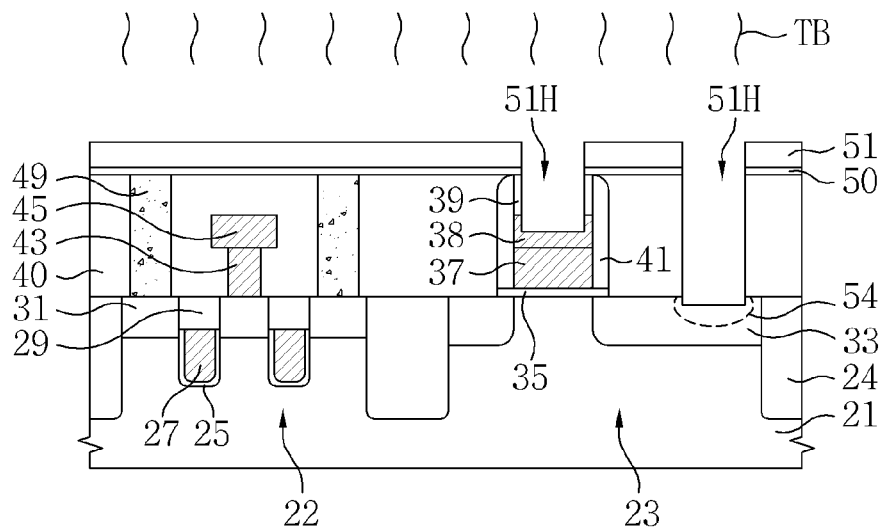

Referring to FIG. 7, a thermal process TB, such as, for example, an thermal process, may be performed to activate the impurities implanted into the plug impurity region 54. The thermal process TB may include exposing the semiconductor substrate 21 having the preliminary plugs 49 and the plug impurity region 54 to an atmosphere having a temperature between about 600° C. and about 1150° C. For example, the thermal process TB may be performed at a temperature of about 1100° C. for several seconds using rapid thermal processing (RTP). According to an embodiment, the thermal process TB may be performed at a temperature between about 600° C. and about 1000° C.

Figure 8:
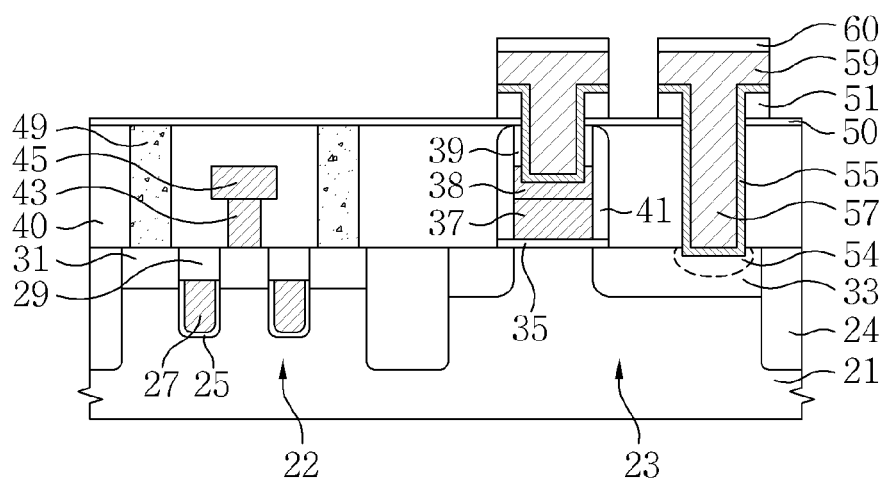

Referring to FIG. 8, a peripheral barrier layer 55, peripheral plugs 57, peripheral interconnections 59 and peripheral interconnection capping patterns 60 may be formed. The peripheral barrier layer 55, the peripheral plugs 57 and the peripheral interconnections 59 may be formed using a thin film formation process and a patterning process. The peripheral interconnection capping patterns 60 may function as a hardmask while the patterning process is performed.

The peripheral plugs 57 may completely fill the peripheral contact holes 51H. The peripheral barrier layers 55 may surround bottoms and sidewalls of the peripheral plugs 57. The peripheral interconnections 59 may cross over the upper insulating layer 51. The upper insulating layer 51 may be maintained between the peripheral interconnections 59 and the first etch stop layer 50. The peripheral interconnection capping patterns 60 may cover the peripheral interconnections 59. The first etch stop layer 50 may be exposed between the peripheral interconnections 59.

The peripheral barrier layer 55 may be formed of Ti, TiN, TiAlN, TiSiN, TaN, TaAlN, TaSiN or a combination thereof. The peripheral plugs 57 and the peripheral interconnections 59 may be formed of a polysilicon layer or a metal layer. The metal layer may include W, Cu, or Al. For example, the peripheral plugs 57 and the peripheral interconnections 59 may be formed of a W layer. The peripheral interconnection capping patterns 60 may be formed of an insulating layer such as a silicon oxide layer, a silicon nitride layer, a silicon oxynitride layer or a combination thereof.

Figure 9:
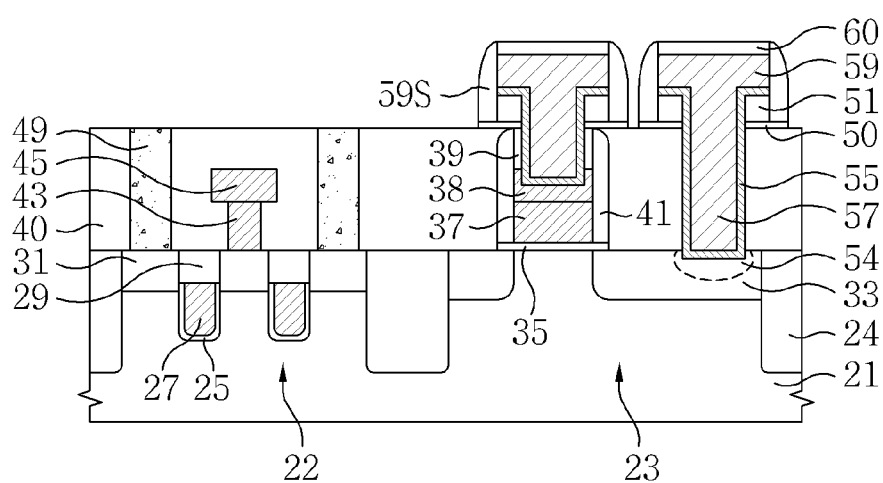
Figure 10:
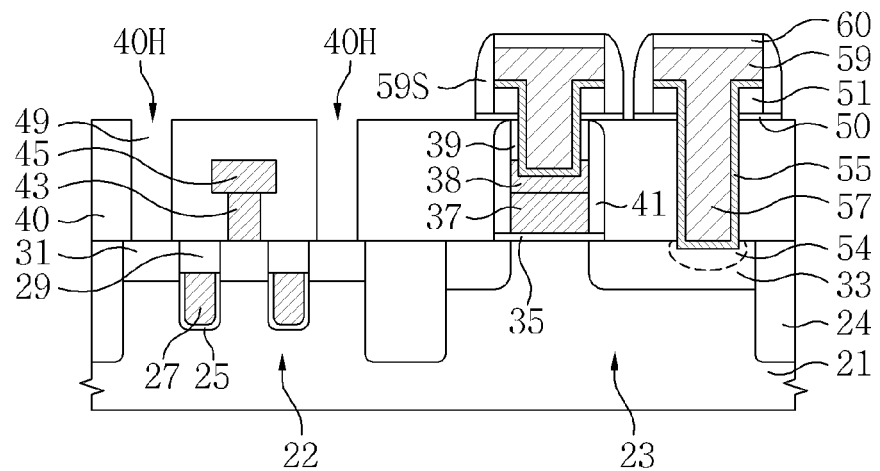

Referring to FIGS. 9 and 10, peripheral interconnection spacers 59S may be formed on sidewalls of the peripheral interconnection capping patterns 60 and the peripheral interconnections 59. While the peripheral interconnection spacers 59S are formed, part of the first etch stop layer 50 may be removed. As a result, the first etch stop layer 50 may be maintained below the peripheral interconnection spacers 59S and the upper insulating layer 51. Top surfaces of the preliminary plugs 49 may be exposed. The peripheral interconnection spacers 59S may be formed of an insulating layer such as a silicon oxide layer, a silicon nitride layer, a silicon oxynitride layer or a combination thereof.

Afterwards, the preliminary plugs 49 may be removed to expose the contact holes 40H.

Figure 11A:
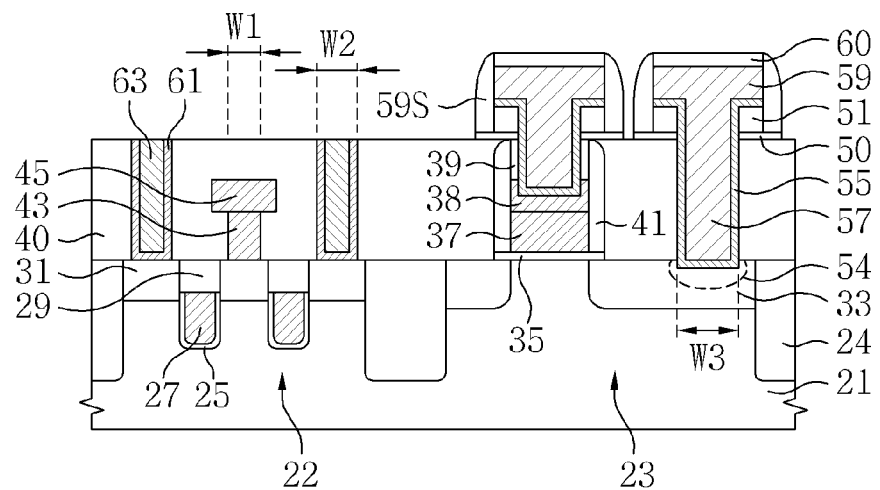

Referring to FIG. 11A, a cell barrier layer 61 and buried contact plugs 63 may be formed in the contact holes 40H. The cell barrier layer 61 and the buried contact plugs 63 may be formed using a thin film formation process and an etch-back process. According to an embodiment, a mask pattern (not shown) for covering the second active region 23 and exposing the first active region 22 may be employed for forming the cell barrier layer 61 and the buried contact plugs 63.

The cell barrier layers 61 may surround sidewalls and bottoms of the buried contact plugs 63.

The cell barrier layer 61 may be formed of Ti, TiN, TiAlN, TiSiN, TaN, TaAlN, TaSiN or a combination thereof. The buried contact plugs 63 may be formed of a noble metal, a noble metal oxide or a perovskite-based conductive oxide. The buried contact plugs 63 may be formed of Pt, Ru, Ir, PtO, $RuO_2$, $IrO_2$, $SrRuO_3$, $BaRuO_3$, $CaRuO_3$, $(Ba,Sr)RuO_3$ or $La(Sr,Co)O_3$.

Since the buried contact plugs 63 may be formed after the thermal process TB, thermal deformation of the buried contact plugs 63 may be prevented. Accordingly, the buried contact plugs 63 may exhibit significantly improved current drivability over the conventional art.

Figure 11B:
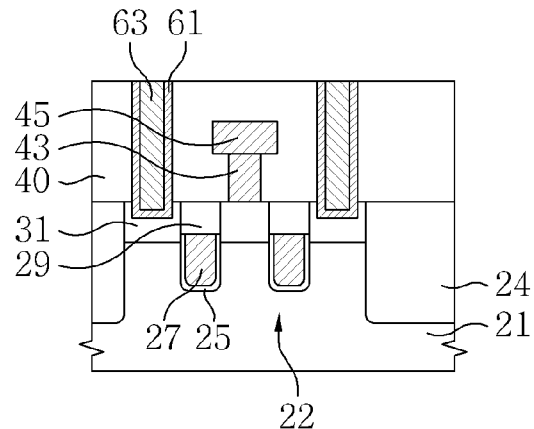

Referring to FIG. 11B, lower ends of the cell barrier layer 61 and the buried contact plugs 63 may protrude downwardly to a lower level than top surfaces of the cell source/drain regions 31, e.g., a top surface of the substrate 21.

Figure 11C:
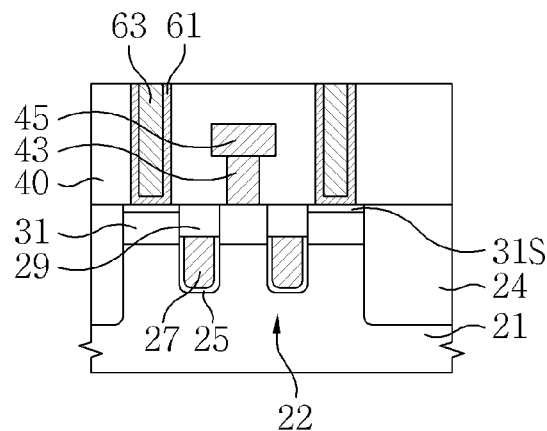

Referring to FIG. 11C, cell metal silicide layers 31S may be formed on the cell source/drain regions 31. The cell barrier layer 61 and the buried contact plugs 63 may be connected with the cell metal silicide layers 31S.

Figure 11D:
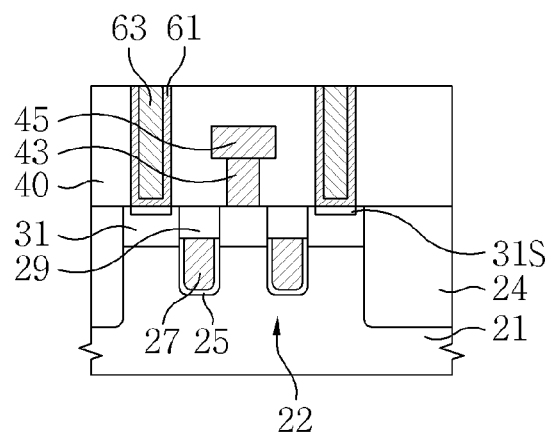

Referring to FIG. 11D, cell metal silicide layers 31S may be formed between the cell source/drain regions 31 and the buried contact plugs 63. The cell metal silicide layers 31S may be aligned with the cell barrier layer 61 and the buried contact plugs 63.

Figure 11E:
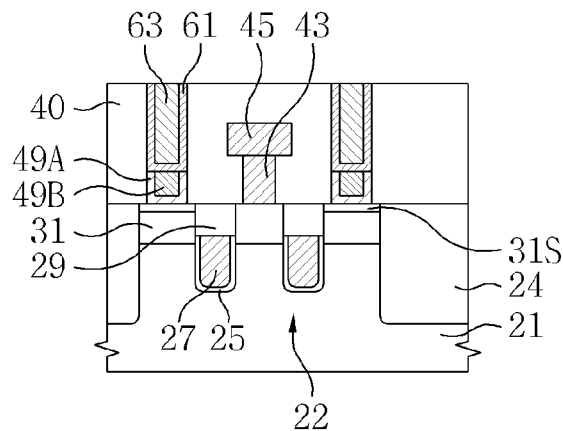

Referring to FIG. 11E, recessed plugs 49A and 49B may be maintained between the cell barrier layer 61 and the cell metal silicide layers 31S. The recessed plugs 49A and 49B may be formed by removing part of the preliminary plugs 49. The recessed plugs 49A and 49B may include a metal layer 49B and a barrier layer 49A surrounding a sidewall and a bottom of the metal layer 49B. According to an embodiment, the metal layer 49B may be formed of W.

Referring back to FIG. 11A, a semiconductor device according to an embodiment of the inventive concept will be described in detail below.

Referring to FIG. 11A, a semiconductor device according to an embodiment of the inventive concept may include the interlayer insulating layer 40, the bit plug 43, the cell barrier layer 61, the buried contact plugs 63, the peripheral barrier layer 55 and the peripheral plugs 57. The bit plug 43 may be also referred to as a first conductive plug 43 having a first width W1. The cell barrier layer 61 and the buried contact plugs 63 may be also referred to as second conductive plugs 61 and 63 having a second width W2. The peripheral barrier layer 55 and the peripheral plugs 57 may be also referred to as third conductive plugs 55 and 57 having a third width W3. According to an embodiment, the third width W3 may be greater than the second width W2.

The first conductive plug 43 may be formed at a lower level than top surfaces of the second conductive plugs 61 and 63. Top surfaces of the second conductive plugs 61 and 63 and the interlayer insulating layer 40 may be exposed on the same or substantially the same planar surface. The third conductive plugs 55 and 57 may be elongated to a higher level than the top surfaces of the second conductive plugs 61 and 63. Each of the second conductive plugs 61 and 63 may penetrate the interlayer insulating layer 40 and may be electrically connected to a corresponding one of the cell source/drain regions 31. According to an embodiment, the cell source/drain regions 31 may be also referred to as lower conductive patterns.

FIGS. 12 to 15 are cross-sectional views illustrating a method of forming a semiconductor device and devices related to the semiconductor device according to an embodiment of the inventive concept.

Figure 12:
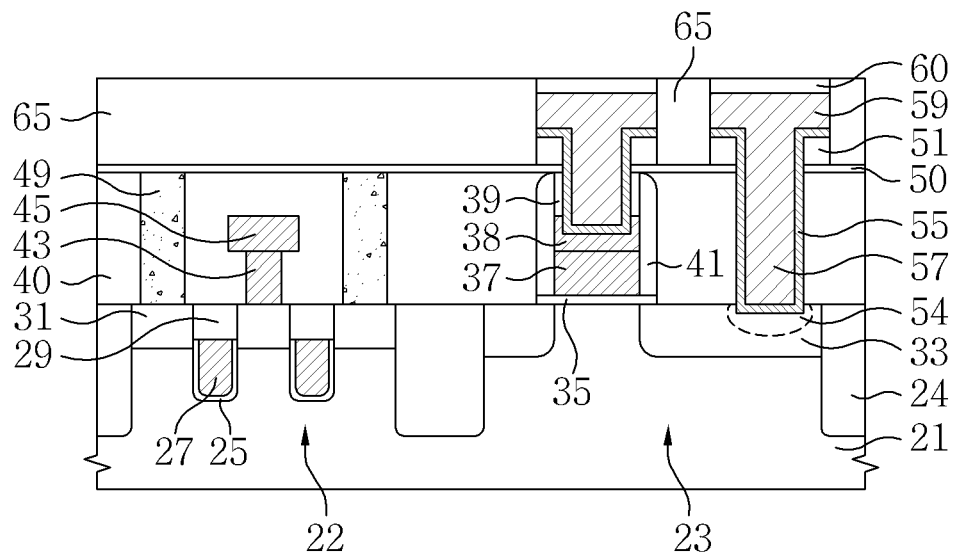
FIGS. 12 to 15 are cross-sectional views illustrating a method of forming a semiconductor device and devices related to the semiconductor device according to an embodiment of the inventive concept.

Referring to FIG. 12, a first active region 22, a second active region 23, an isolation layer 24, a cell gate dielectric layer 25, a cell gate electrode 27, a cell gate capping pattern 29, cell source/drain regions 31, a peripheral gate dielectric layer 35, peripheral gate electrodes 37 and 38, a peripheral gate capping pattern 39, a gate spacer 41, peripheral source/drain regions 33, an interlayer insulating layer 40, a bit plug 43, a bit line 45, preliminary plugs 49, a first etch stop layer 50, an upper insulating layer 51, a plug impurity region 54, a peripheral barrier layer 55, peripheral plugs 57, peripheral interconnections 59 and peripheral interconnection capping patterns 60 may be formed on a semiconductor substrate 21 in the same or similar manner as that described with reference to FIGS. 1 to 8. The descriptions below focus on some of the differences.

A mold layer 65 covering an entire top surface of the semiconductor substrate 21 may be formed. The mold layer 65 may have a planarized top surface. The mold layer 65 may be formed of an insulating layer such as a silicon oxide layer, a silicon nitride layer, a silicon oxynitride layer or a combination thereof.

Figure 13:
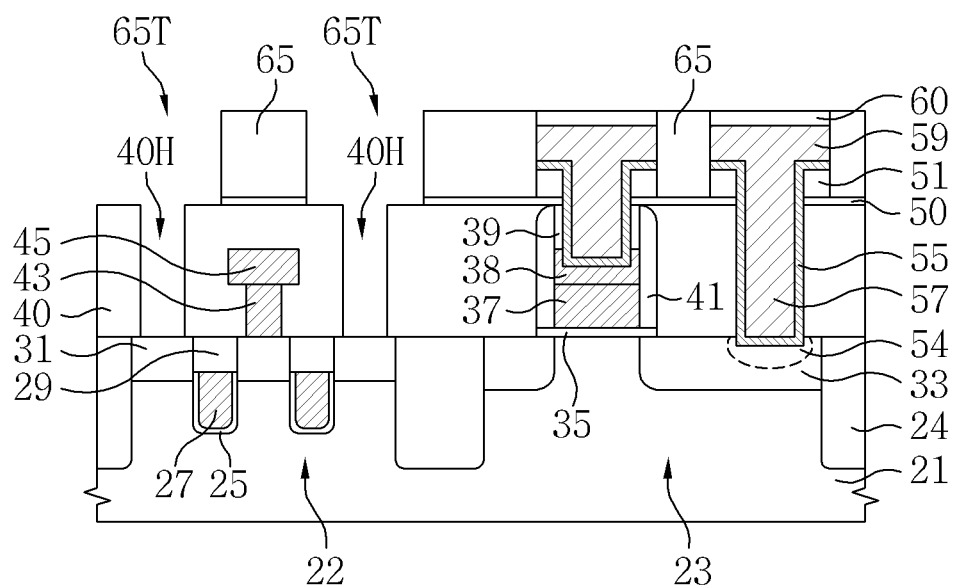

Referring to FIG. 13, the mold layer 65 may be patterned, and trenches 65T crossing the preliminary plugs 49 may be formed. Then, the preliminary plugs 49 may be removed, and contact holes 40H below the trenches 65T may be formed.

Figure 14:
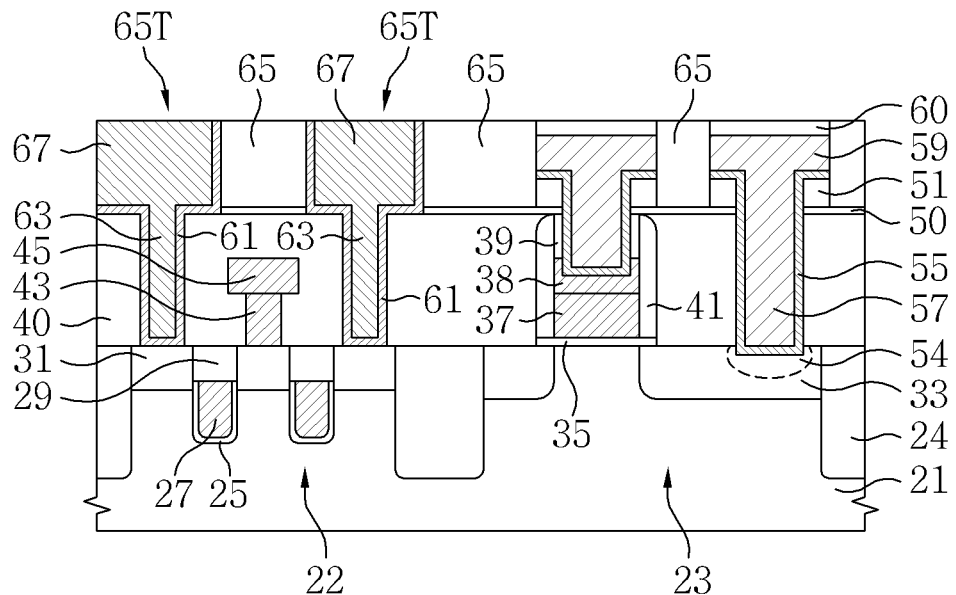

Referring to FIG. 14, a cell barrier layer 61, buried contact plugs 63 and cell interconnections 67 may be formed in the contact holes 40H and the trenches 65T. The cell barrier layer 61, the buried contact plugs 63 and the cell interconnections 67 may be formed using a thin film formation process and a planarization process. The planarization process may include a chemical mechanical polishing (CMP) process or an etch-back process.

The cell barrier layer 61 may surround sidewalls and a bottom of the buried contact plugs 63 and the cell interconnections 67. The buried contact plugs 63 and the cell interconnections 67 may be formed of the same material in an integrally-formed structure. The buried contact plugs 63 and the cell interconnections 67 may be formed of a noble metal, a noble metal oxide layer or a perovskite-based conductive oxide layer.

Bottoms of the cell interconnections 67 may be formed at a lower level than top surfaces of the peripheral plugs 57. The top surfaces of the cell interconnections 67 may be formed at a higher level than the peripheral interconnections 59. According to an embodiment, the top surfaces of the cell interconnections 67 and the peripheral interconnections 59 may be formed to have substantially the same level.

Figure 15:
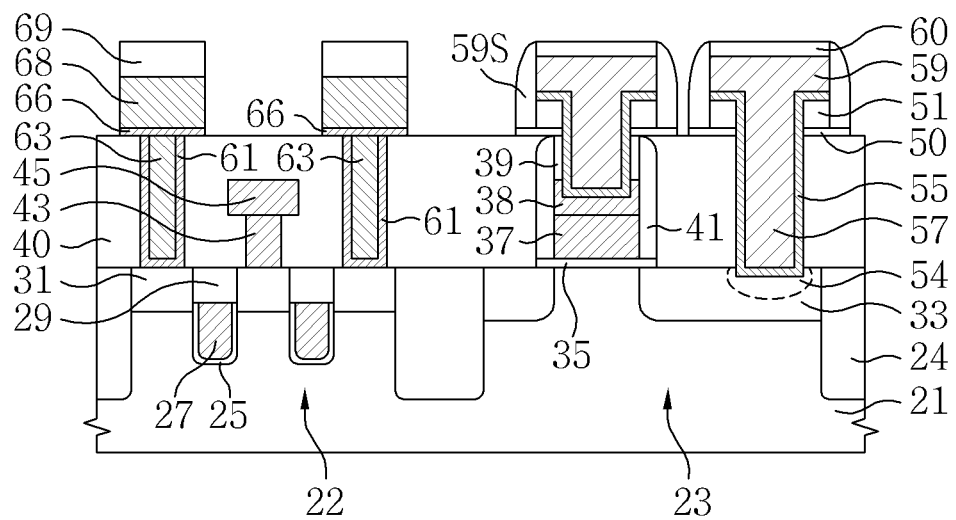

Referring to FIG. 15, a first active region 22, a second active region 23, an isolation layer 24, a cell gate dielectric layer 25, a cell gate electrode 27, a cell gate capping pattern 29, cell source/drain regions 31, a peripheral gate dielectric layer 35, peripheral gate electrodes 37 and 38, a peripheral gate capping pattern 39, a gate spacer 41, peripheral source/drain regions 33, an interlayer insulating layer 40, a bit plug 43, a bit line 45, preliminary plugs 49, a first etch stop layer 50, an upper insulating layer 51, a plug impurity region 54, a peripheral barrier layer 55, peripheral plugs 57, peripheral interconnections 59, peripheral interconnection capping patterns 60, peripheral interconnection spacers 59S, cell barrier layer 61 and buried contact plugs 63 may be formed on a semiconductor substrate 21 in the same or similar manner as that described with reference to FIGS. 1 to 11A.

An upper barrier layer 66, cell interconnections 68 and cell interconnection capping patterns 69 crossing the buried contact plugs 63 may be sequentially formed on the interlayer insulating layer 40. The cell interconnection capping patterns 69 may function as a hardmask while the upper barrier layer 66 and the cell interconnections 68 are formed.

Figure 29:
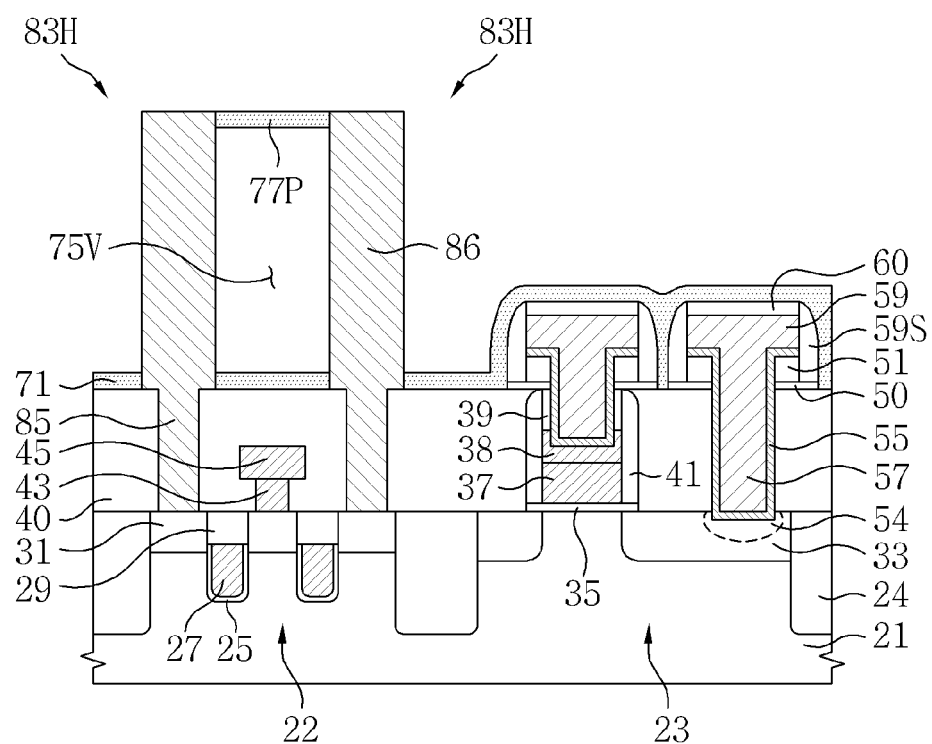
Figure 30:
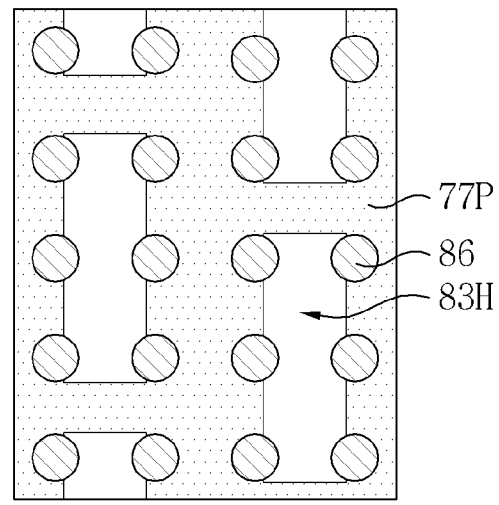
FIG. 30 is a layout diagram illustrating a part of the semiconductor device according to an embodiment of the inventive concept.

FIGS. 16 to 29, 31 to 32B are cross-sectional views illustrating a method of forming a semiconductor device and devices related to the semiconductor device according to an embodiment of the inventive concept, and FIG. 30 is a layout diagram illustrating a part of a semiconductor device according to an embodiment of the inventive concept.

Figure 16:
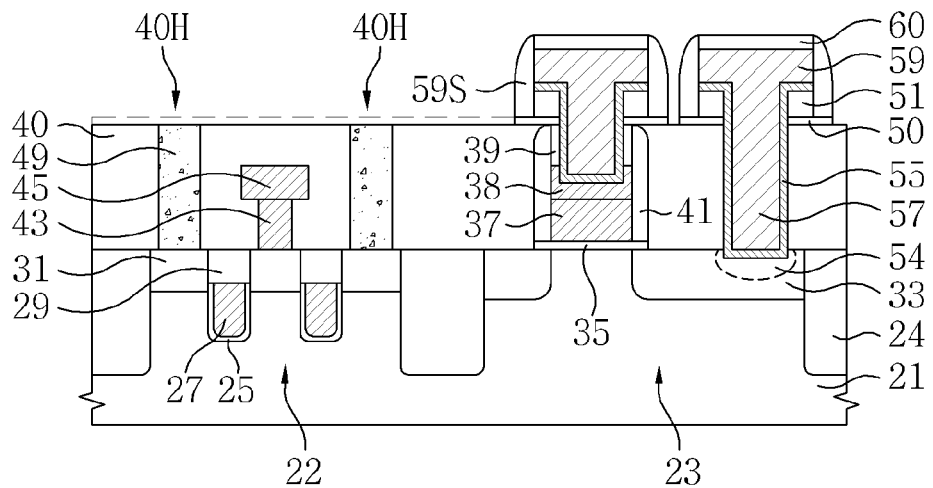
FIGS. 16 to 29, 31 to 32B are cross-sectional views illustrating a method of forming a semiconductor device and devices related to the semiconductor device according to an embodiment of the inventive concept.

Referring to FIG. 16, a first active region 22, a second active region 23, an isolation layer 24, a cell gate dielectric layer 25, a cell gate electrode 27, a cell gate capping pattern 29, cell source/drain regions 31, a peripheral gate dielectric layer 35, peripheral gate electrodes 37 and 38, a peripheral gate capping pattern 39, a gate spacer 41, peripheral source/drain regions 33, an interlayer insulating layer 40, contact holes 40H, a bit plug 43, a bit line 45, preliminary plugs 49, a first etch stop layer 50, an upper insulating layer 51, a plug impurity region 54, a peripheral barrier layer 55, peripheral plugs 57, peripheral interconnections 59, peripheral interconnection capping patterns 60 and peripheral interconnection spacers 59S may be formed on a semiconductor substrate 21 in the same or similar manner as that described with reference to FIGS. 1 to 9.

Preliminary plugs 49 may be maintained in the contact holes 40H.

According to an embodiment, the peripheral interconnection spacers 59S may be omitted. According to an embodiment, the first etch stop layer 50 may cover the preliminary plugs 49 and the interlayer insulating layer 40.

Figure 17:
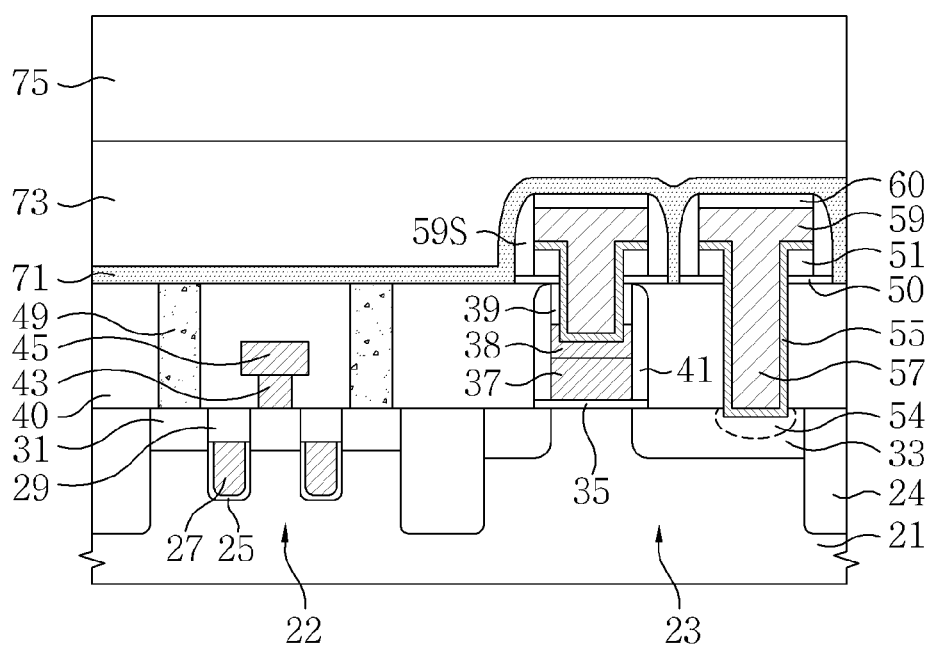

Referring to FIG. 17, a second etch stop layer 71, a first mold layer 73 and a second mold layer 75 may be sequentially formed on the semiconductor substrate 21. The first mold layer 73 may be formed of a different material layer from the second mold layer 75. For example, the first mold layer 73 may be formed of a borophospho silicate glass (BPSG) layer, and the second mold layer 75 may be formed of a tetra ethyl ortho silicate (TEOS) layer or a high density plasma (HDP) oxide layer.

The second etch stop layer 71 may be formed of a material layer having an etch selectivity with respect to the first mold layer 73. For example, the second etch stop layer 71 may be formed of a silicon nitride layer. The second etch stop layer 71 may cover the preliminary plugs 49, the interlayer insulating layer 40, the peripheral interconnections 59 and the peripheral interconnection capping patterns 60.

Figure 18:
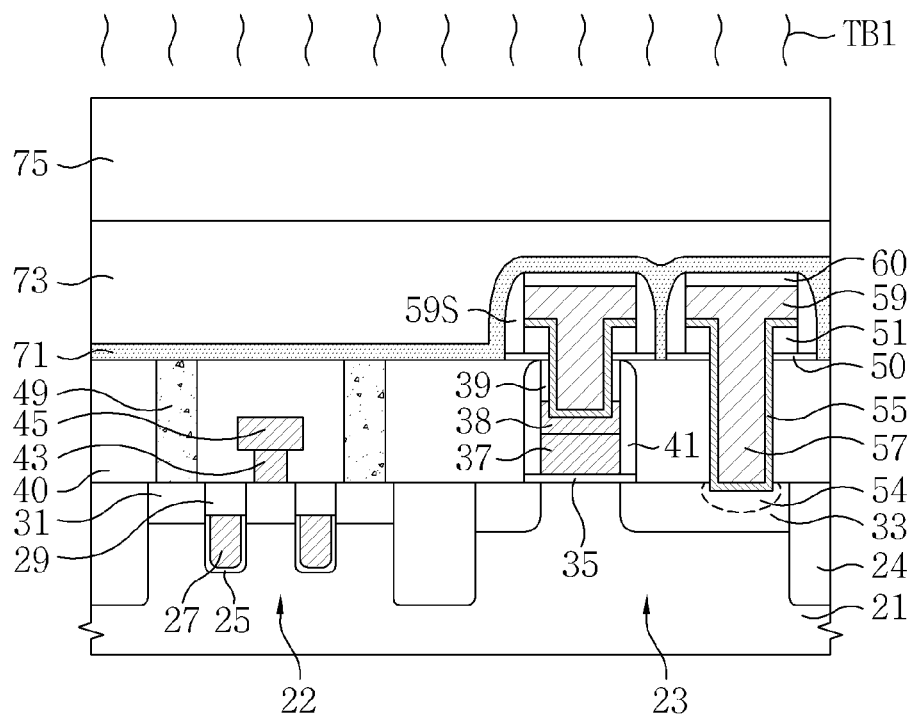

Referring to FIG. 18, a first thermal process TB1 may be used for densification of the second mold layer 75. The first thermal process TB1 may include exposing the semiconductor substrate 21 having the preliminary plugs 49 and the second mold layer 75 to an atmosphere having a temperature between about 600° C. and about 1150° C. For example, the first thermal process TB1 may be performed at a temperature between about 600° C. and about 700° C. for about 10 to about 60 minutes.

Figure 19:
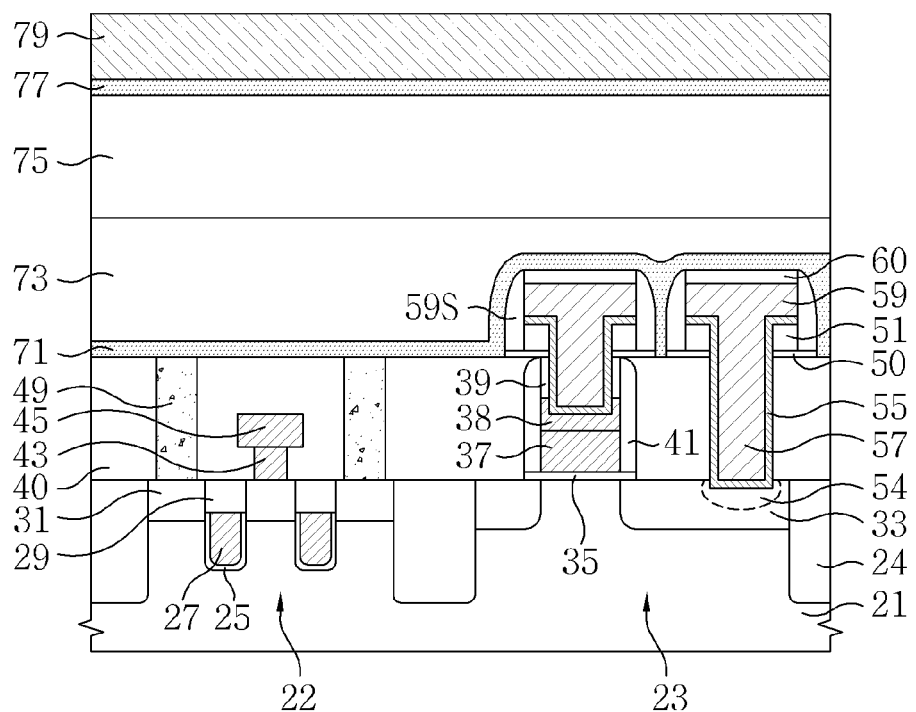

Referring to FIG. 19, a support layer 77 and a mask layer 79 may be sequentially formed on the second mold layer 75. The support layer 77 may be formed of a silicon nitride layer or a TaO layer. The mask layer 79 may be formed of a polysilicon layer.

Figure 20:
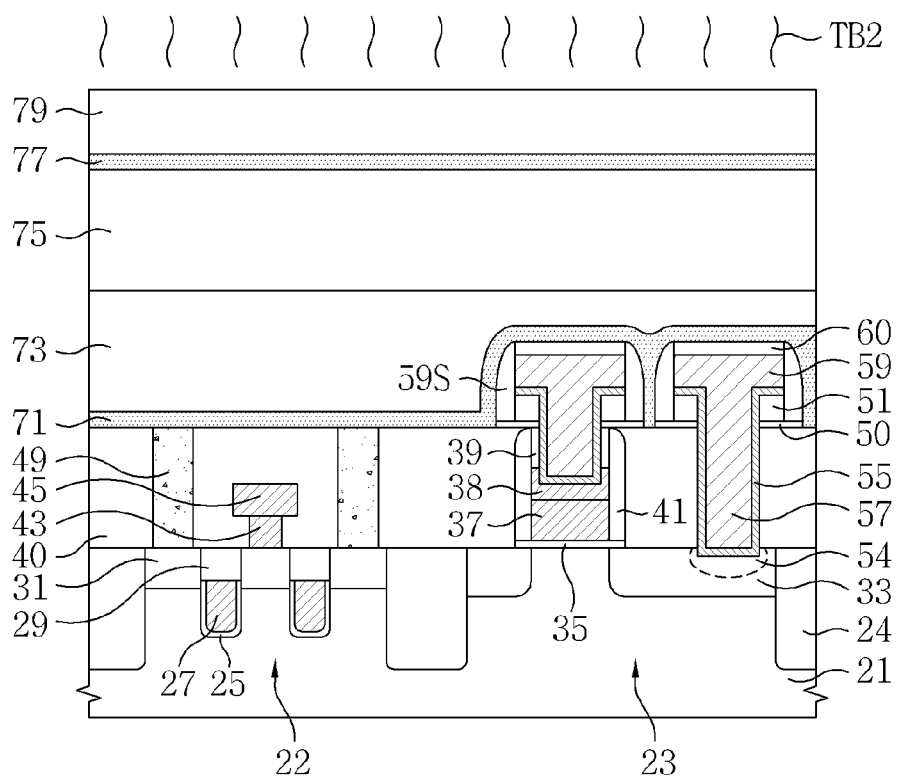

Referring to FIG. 20, a second thermal process TB2 may be used to crystallize the mask layer 79. The second thermal process TB2 may include exposing the semiconductor substrate 21 having the preliminary plugs 49 and the mask layer 79 to an atmosphere having a temperature between about 600° C. and about 1150° C. For example, the second thermal process TB2 may be performed at a temperature between about 600° C. and about 700° C. for about 10 to about 60 minutes, or at a temperature between about 900° C. and about 1150° C. for several minutes.

Figure 21:
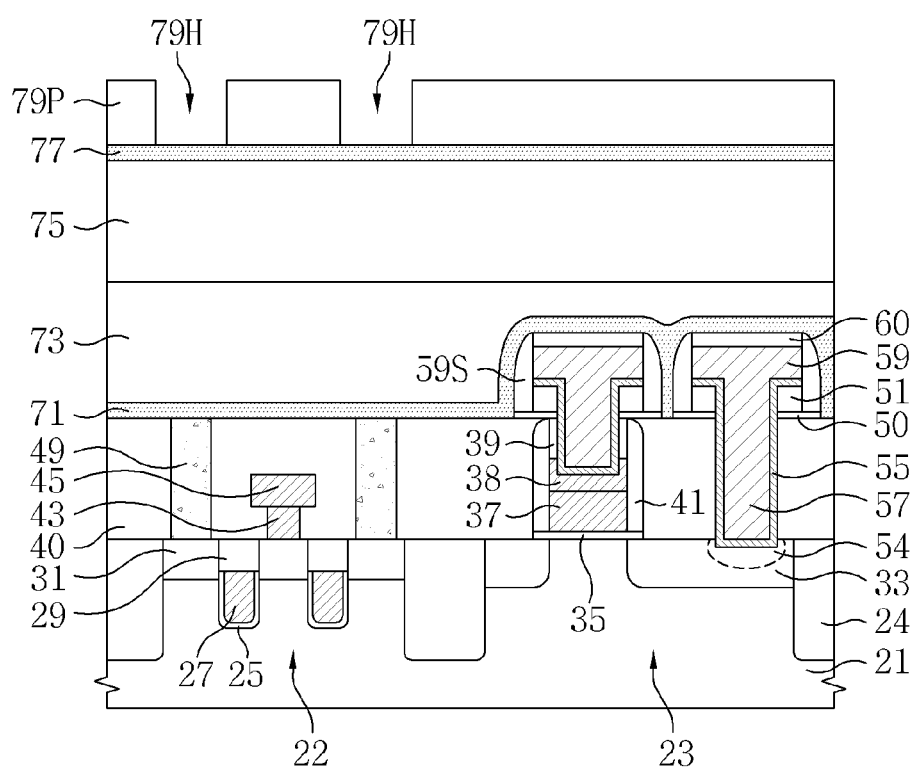
Figure 22:
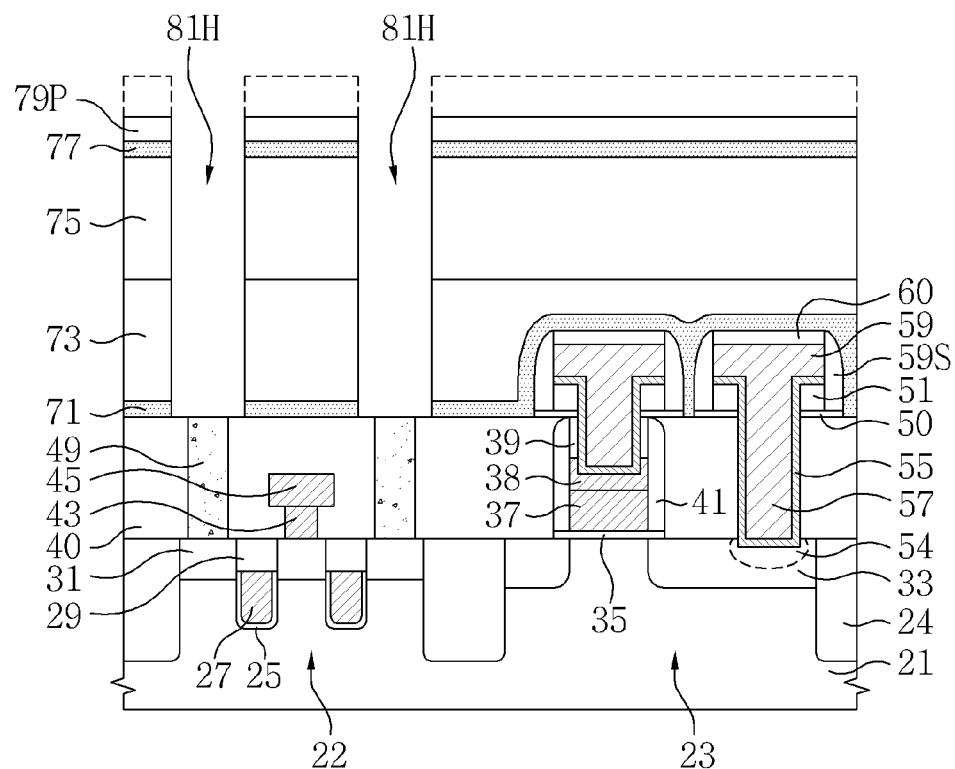

Referring to FIGS. 21 and 22, the mask layer 79 may be patterned, and a hardmask pattern 79P having openings 79H may be formed. The hardmask pattern 79P may be used as an etch mask to form electrode holes 81H penetrating the support layer 77, the second mold layer 75, the first mold layer 73 and the second etch stop layer 71, and exposing the preliminary plugs 49.

Figure 23:
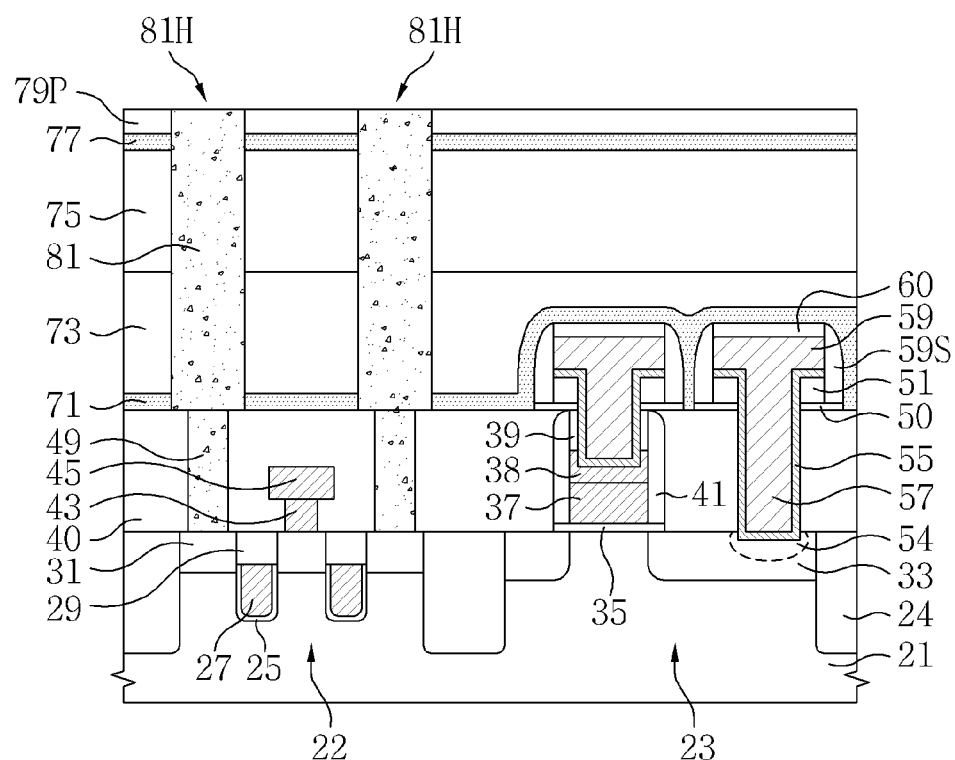

Referring to FIG. 23, preliminary electrodes 81 may be formed in the electrode holes 81H. The preliminary electrodes 81 may be formed using a thin film formation process and a planarization process. The preliminary electrodes 81 may completely fill the electrode holes 81H.

The preliminary electrodes 81 may be formed of a material layer having an etch selectivity with respect to the support layer 77, the second mold layer 75, the first mold layer 73 and the second etch stop layer 71. The preliminary electrodes 81 may be formed of the same material layer as the preliminary plugs 49. The preliminary electrodes 81 may be formed of a polysilicon layer, a metal layer, an insulating layer or a combination thereof.

Figure 24:
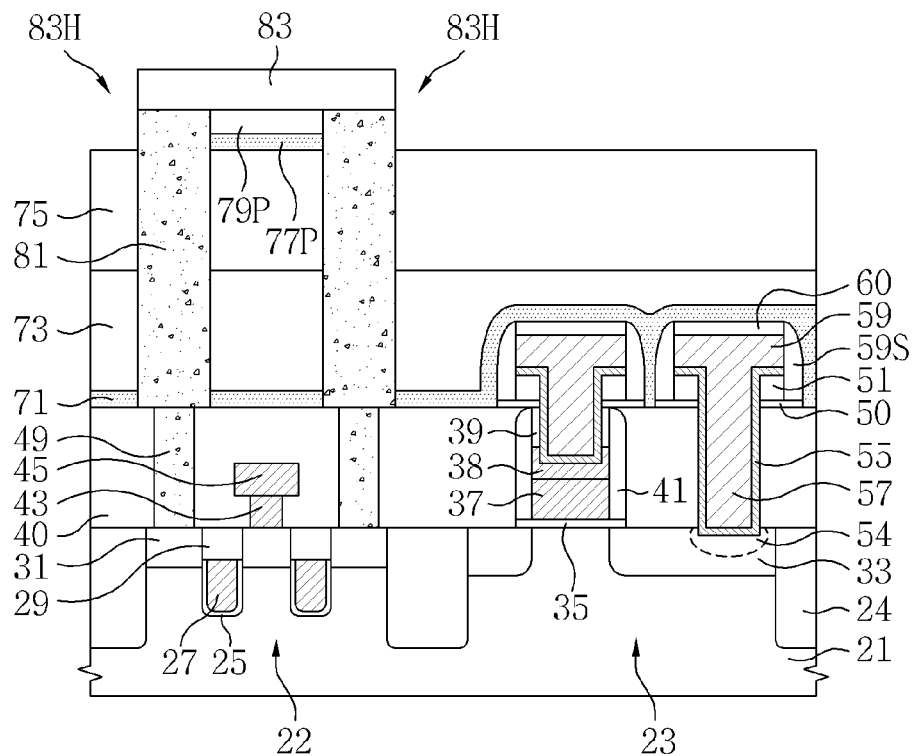
Figure 25:
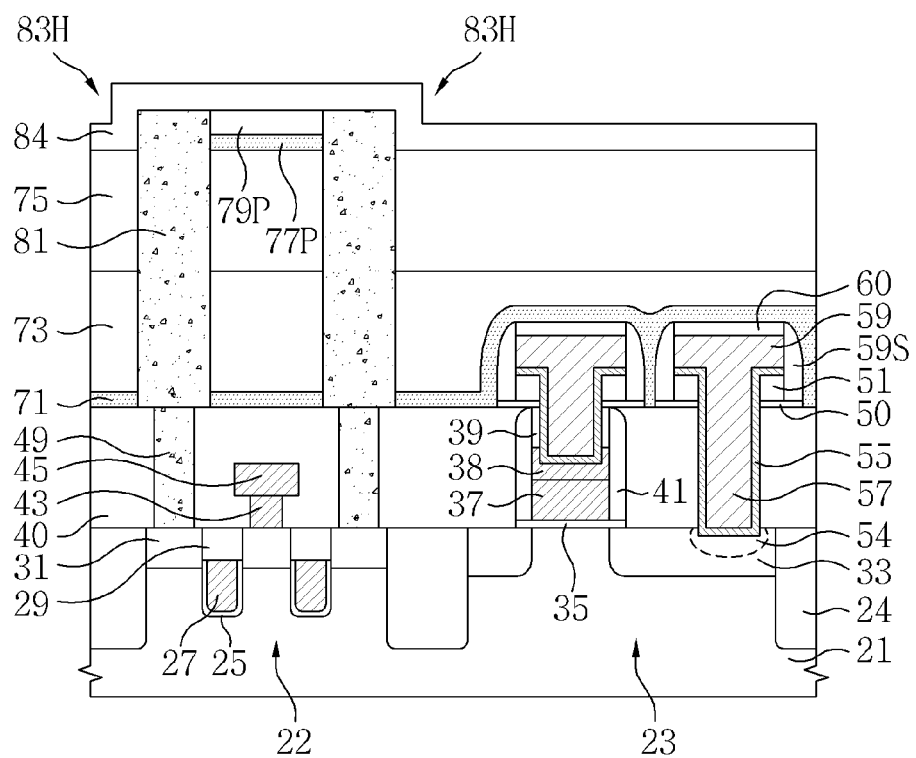

Referring to FIGS. 24 and 25, a support mask pattern 83 may be formed on the hardmask pattern 79P. The hardmask pattern 79P and the support layer 77 may be patterned using the supporter mask pattern 83 as an etch mask, so that a supporter 77P and a supporter opening 83H may be formed. The supporter opening 83H may penetrate the support layer 77. The second mold layer 75 may be exposed on a bottom of the supporter opening 83H. The supporter 77P, the preliminary electrodes 81 and the hardmask pattern 79P may be maintained below the support mask pattern 83. Afterwards, the support mask pattern 83 may be removed to expose the second mold layer 75, the preliminary electrodes 81 and the hardmask pattern 79P.

A gapfill insulating layer 84 may be formed on an entire top surface of the semiconductor substrate 21. The gapfill insulating layer 84 may fill the supporter opening 83H and cover the preliminary electrodes 81 and the hardmask pattern 79P. The gapfill insulating layer 84 may be formed of a silicon oxide layer, a silicon nitride layer, a silicon oxynitride layer or a combination thereof.

Figure 26:
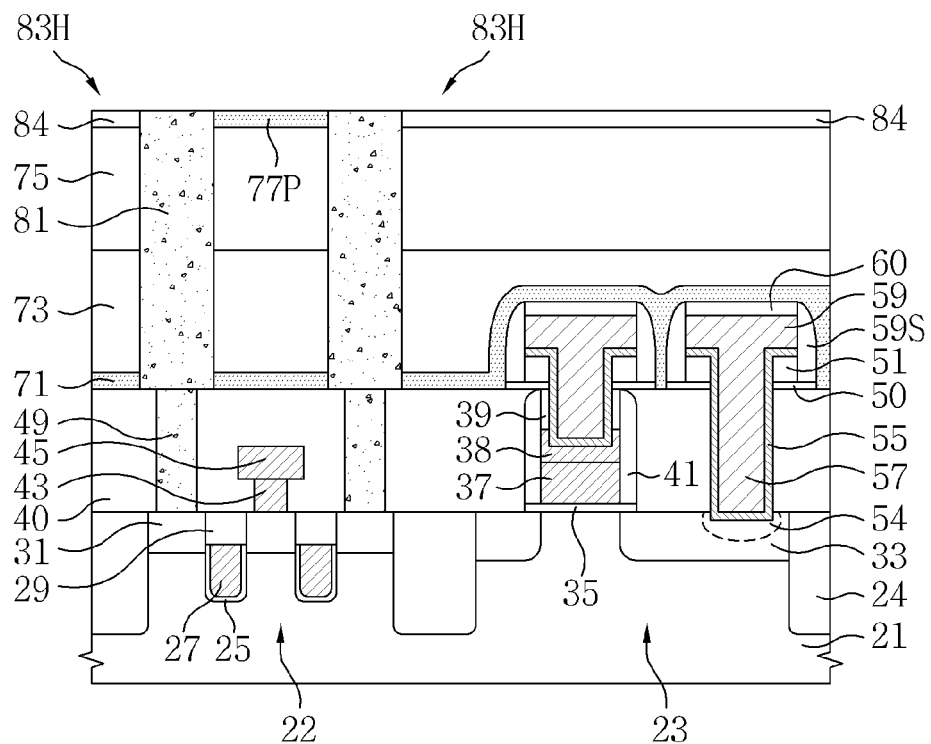

Referring to FIG. 26, the gapfill insulating layer 84 and the hardmask pattern 79P may be planarized, and the preliminary electrodes 81 may be exposed. The planarization may employ a chemical mechanical polishing (CMP) process. As a result, the gapfill insulating layer 84 may be maintained within the supporter opening 83H. According to an embodiment, the hardmask pattern 79P may be completely removed, and a top surface of the supporter 77P may be removed.

Figure 27:
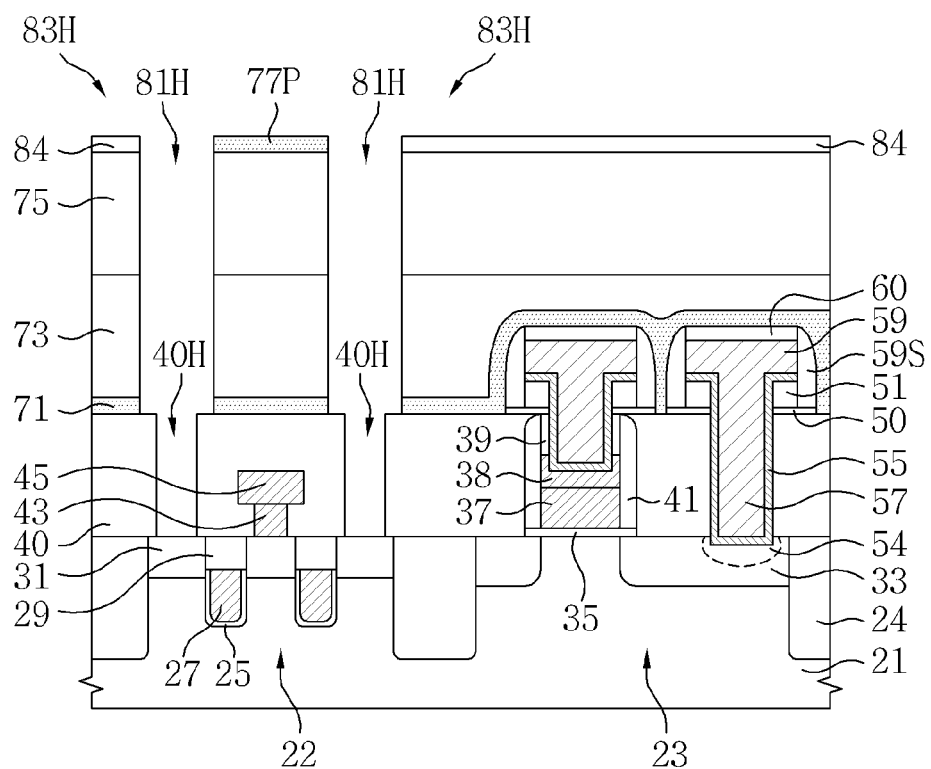
Figure 28:
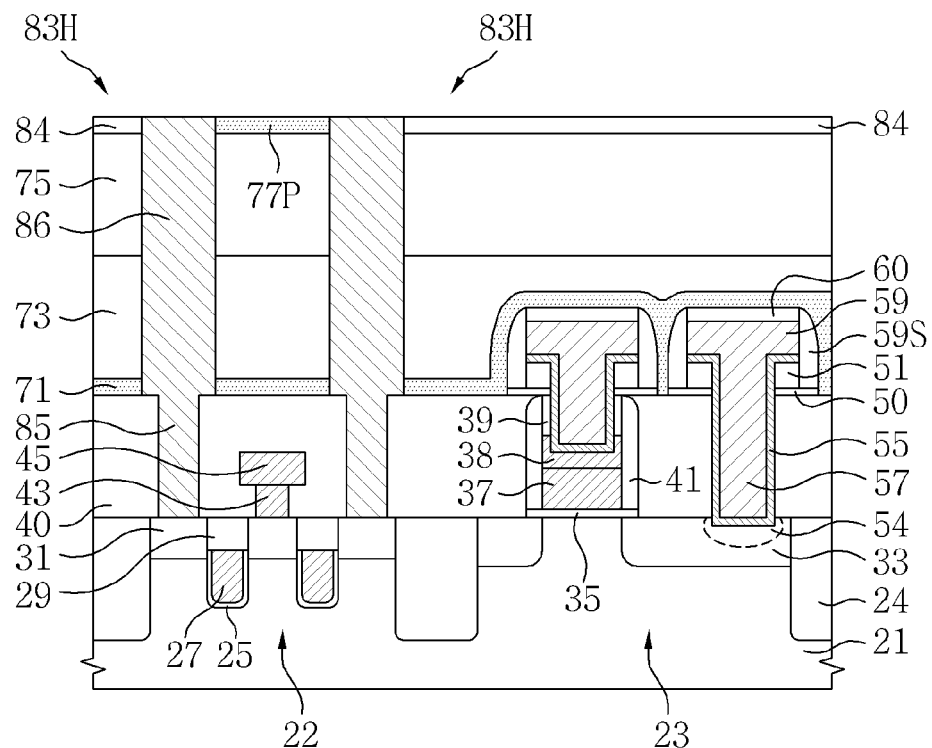

Referring to FIGS. 27 and 28, the preliminary electrodes 81 and the preliminary plugs 49 may be sequentially removed, and the electrode holes 81H and the contact holes 40H may be exposed. The preliminary electrodes 81 and the preliminary plugs 49 may be removed by a wet etching method having a selectivity ratio and an etch-back process.

Buried contact plugs 85 and lower electrodes 86 may be formed in the contact holes 40H and the electrode holes 81H, respectively. Each of the buried contact plugs 85 and a lower electrode 86 corresponding to the buried contact plug 85 may have an integrally-formed structure. The buried contact plugs 85 and the lower electrodes 86 may be formed using a thin film formation process and a planarization process. The buried contact plugs 85 may be formed of the same material layer as the lower electrodes 86. The buried contact plugs 85 and the lower electrodes 86 may be formed of a noble metal, a noble metal oxide or a perovskite-based conductive oxide. The buried contact plugs 85 and the lower electrodes 86 may be formed of Pt, Ru, Ir, PtO, $RuO_2$, $IrO_2$, $SrRuO_3$, $BaRuO_3$, $CaRuO_3$, $(Ba,Sr)RuO_3$ or $La(Sr,Co)O_3$. The lower electrodes 86 may be in continuity with the buried contact plugs 85.

Referring to FIGS. 29 and 30, the gapfill insulating layer 84, the second mold layer 75 and the first mold layer 73 may be removed, and the lower electrodes 86 may be exposed. The supporter 77P may contact sidewalls of the lower electrodes 86. An empty space 75V may be formed between the supporter 77P and the second etch stop layer 71. Each of the lower electrodes 86 may be in the shape of a pillar. A top surface of the second etch stop layer 71 may be exposed. FIG. 30 is a layout diagram illustrating the lower electrodes 86, the supporter 77P and the supporter opening 83H.

Figure 31:
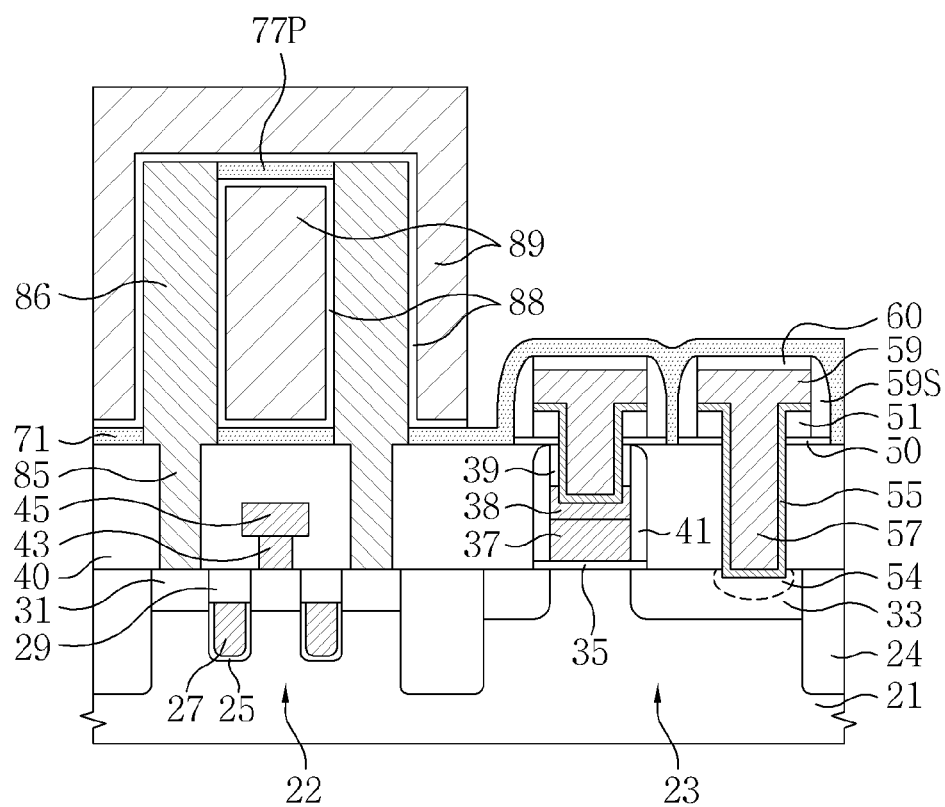

Referring to FIG. 31, a capacitor dielectric layer 88 and an upper electrode 89 may be sequentially formed on the lower electrodes 86. The upper electrode 89 may fill the empty space 75V and cover the lower electrodes 86 and the supporter 77P. The capacitor dielectric layer 88 may be interposed between the lower electrodes 86 and the upper electrode 89. According to an embodiment, bottoms of the lower electrodes 86 may be formed at a lower level than top surfaces of the peripheral plugs 57. According to an embodiment, the lower electrodes 86 may be formed at the same level as the peripheral interconnections 59. According to an embodiment, top surfaces of the lower electrodes 86 may be formed at a higher level than the peripheral interconnections 59.

The capacitor dielectric layer 88 may be formed of $(Ba,Sr)TiO_3$(BST), $SrTiO_3$, $BaTiO_3$, $Ba(Zr,Ti)O_3$, $Sr(Zr,Ti)O_3$, $Pb(Zr,Ti)O_3$, $Ta_2O_5$, $Ta_2O_5N$, $Al_2O_5$, $HfO_2$, $ZrO_2$, or $TiO_2$. The upper electrode 89 may be formed of Pt, Ru, Ir, PtO, $RuO_2$, $IrO_2$, $SrRuO_3$, $BaRuO_3$, $CaRuO_3$, $(Ba,Sr)RuO_3$, or $La(Sr,Co)O_3$.

Figure 32A:
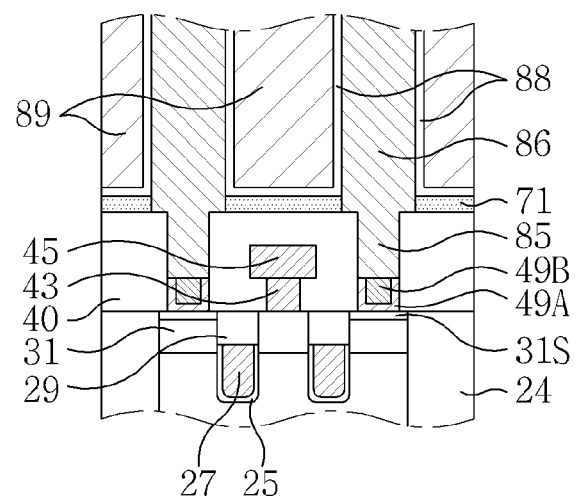

Referring to FIG. 32A, cell metal silicide layers 31S and recessed plugs 49A and 49B may be formed between the buried contact plugs 85 and the cell source/drain regions 31.

The buried contact plugs 85 may be formed after the first thermal process TB1 and the second thermal process TB2, and thus thermal deformation of the buried contact plugs 85 may be prevented. Also, since the lower electrodes 86 may be formed after patterning of the support layer 77 and forming the supporter 77P and the supporter opening 83H, etching damage to the lower electrodes 86 may be prevented. Moreover, the bonding state between the lower electrodes 86 and the supporter 77P may be significantly improved over the conventional art.

Figure 32B:
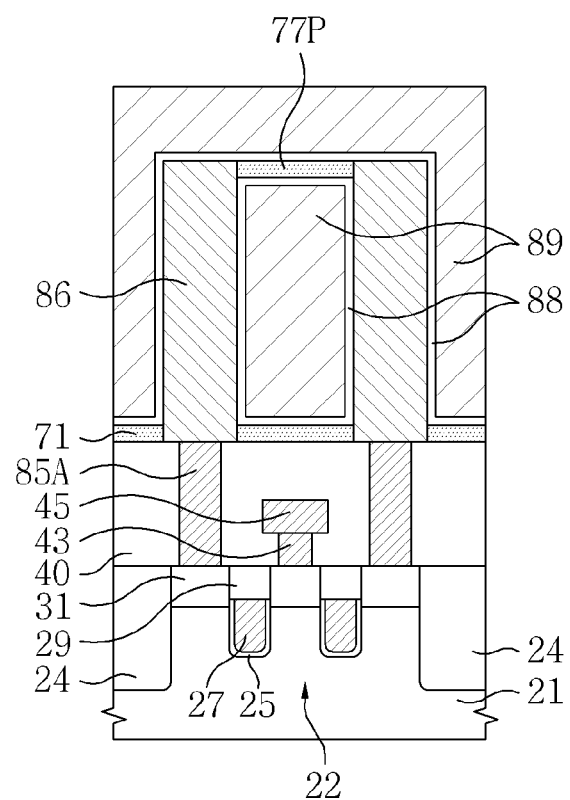

Referring to FIG. 32B, buried contact plugs 85A may be formed prior to the lower electrodes 86. According to an embodiment, the buried contact plugs 85A may be formed of a different material layer from the lower electrodes 86. The buried contact plugs 85A may be formed of a metal, metal silicide, polysilicon or a combination thereof.

FIGS. 33 to 36 are cross-sectional views illustrating a method of forming a semiconductor device and devices related to the semiconductor device according to an embodiment of the inventive concept.

Figure 33:
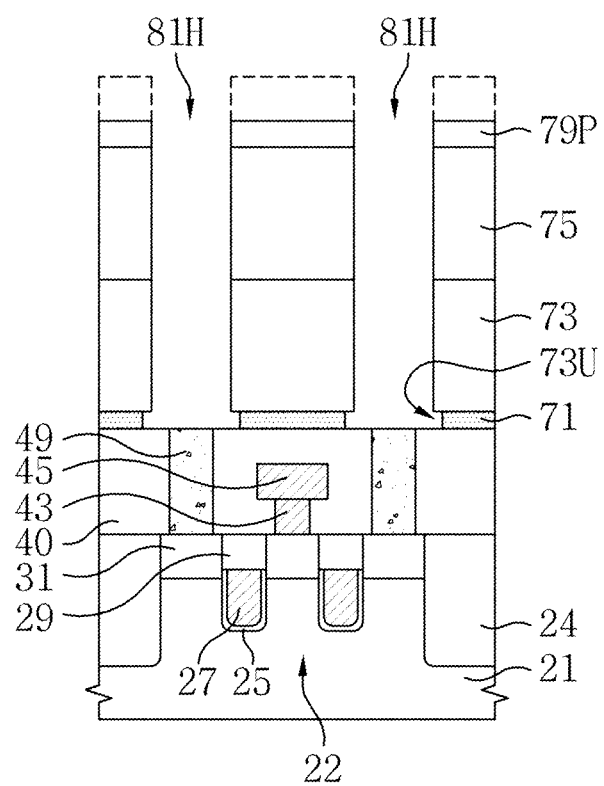
FIGS. 33 to 36 are cross-sectional views illustrating a method of forming a semiconductor device and devices related to the semiconductor device according to an embodiment of the inventive concept.

Referring to FIG. 33, a first active region 22, an isolation layer 24, a cell gate dielectric layer 25, a cell gate electrode 27, a cell gate capping pattern 29, cell source/drain regions 31, an interlayer insulating layer 40, a bit plug 43, a bit line 45, preliminary plugs 49, a second etch stop layer 71, a first mold layer 73, a second mold layer 75 and a hardmask pattern 79P may be formed.

The hardmask pattern 79P may be used as an etch mask to form electrode holes 81H penetrating the second mold layer 75, the first mold layer 73 and the second etch stop layer 71, and exposing the preliminary plugs 49. While the electrode holes 81H are formed, the second etch stop layer 71 may be excessively etched so that undercut regions 73U may be formed under the first mold layer 73.

Figure 34:
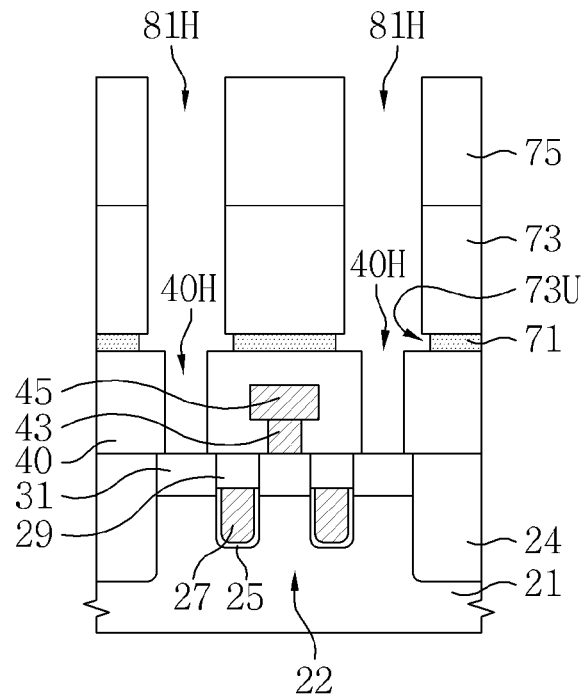
Figure 35:
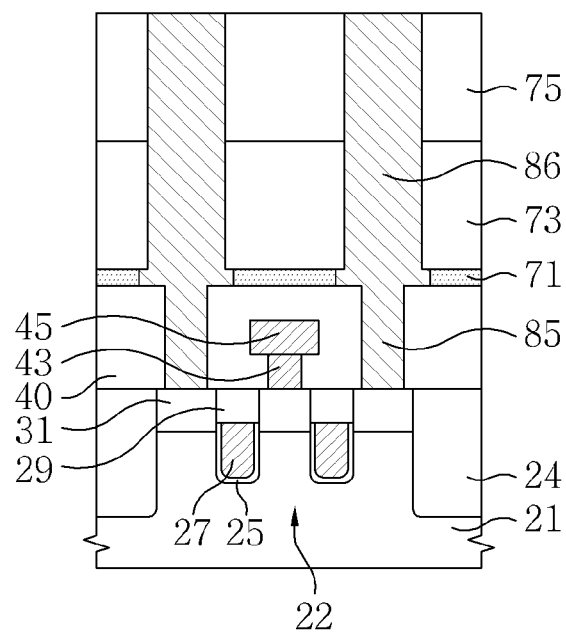

Referring to FIGS. 34 and 35, the preliminary plugs 49 may be removed and contact holes 40H may be exposed in communication with the electrode holes 81H. While the preliminary plugs 49 are removed, the hardmask pattern 79P may be simultaneously removed. According to an embodiment, the hardmask pattern 79P may be removed using a separate process before or after the removal of the preliminary plugs 49.

Buried contact plugs 85 and lower electrodes 86 may be formed in the contact holes 40H and the electrode holes 81H, respectively. The undercut regions 73U may be buried by the lower electrodes 86.

Figure 36:
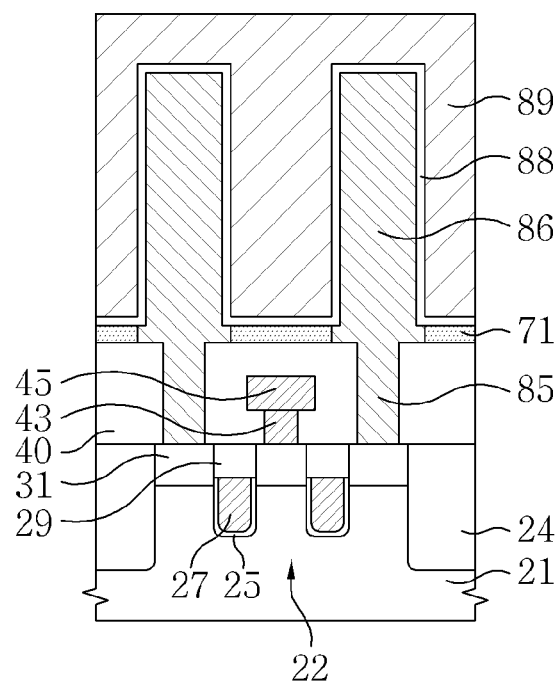

Referring to FIG. 36, the second mold layer 75 and the first mold layer 73 may be removed and the lower electrodes 86 may be exposed. A capacitor dielectric layer 88 and an upper electrode 89 may be sequentially formed on the lower electrodes 86.

According to an embodiment, a supporter 77P having a similar configuration as that illustrated in FIG. 31 may be formed between the lower electrodes 86.

FIGS. 37 to 48 are cross-sectional views illustrating a method of forming a semiconductor device and devices related to the semiconductor device according to an embodiment of the inventive concept.

Figure 37:
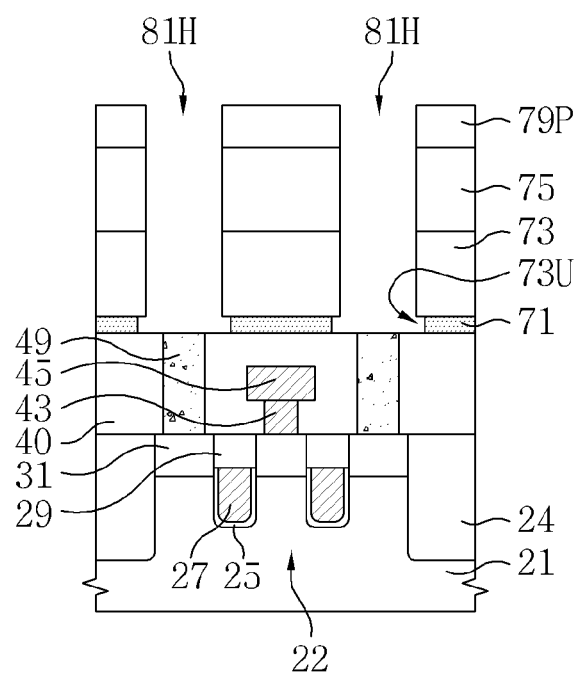
FIGS. 37 to 48 are cross-sectional views illustrating a method of forming a semiconductor device and devices related to the semiconductor device according to an embodiment of the inventive concept.

Referring to FIG. 37, a first active region 22, an isolation layer 24, a cell gate dielectric layer 25, a cell gate electrode 27, a cell gate capping pattern 29, cell source/drain regions 31, an interlayer insulating layer 40, a bit plug 43, a bit line 45, preliminary plugs 49, a second etch stop layer 71, a first mold layer 73, a second mold layer 75 and a hardmask pattern 79P may be formed on a semiconductor substrate 21.

The hardmask pattern 79P may be used as an etch mask to form first electrode holes 81H penetrating the second mold layer 75, the first mold layer 73 and the second etch stop layer 71, and exposing the preliminary plugs 49. While the electrode holes 81H are formed, the second etch stop layer 71 may be etched so that undercut regions 73U may be formed under the first mold layer 73.

Figure 38:
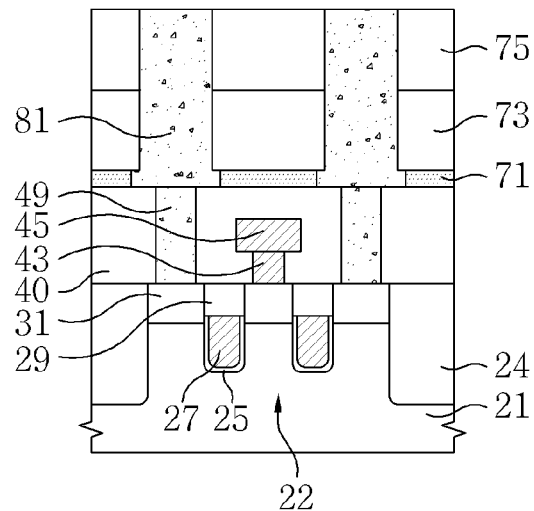
Figure 39:
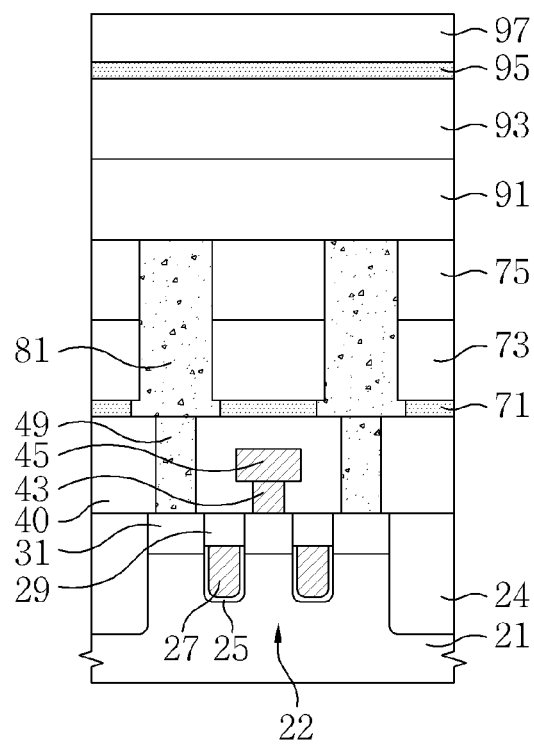

Referring to FIGS. 38 and 39, the hardmask pattern 79P may be removed. First preliminary electrodes 81 may be formed in the first electrode holes 81H. Top surfaces of the first preliminary electrodes 81 and the second mold layer 75 may be exposed on the same or substantially the same planar surface.

A third mold layer 91, a fourth mold layer 93, a support layer 95 and an upper mask layer 97 may be sequentially stacked on the second mold layer 75. The third mold layer 91 may cover the first preliminary electrodes 81. The process of forming the fourth mold layer 93 and the upper mask layer 97 may include thermal processes the same or similar as the first thermal process (TB1 of FIG. 18) and the second thermal process (TB2 of FIG. 20).

Figure 40:
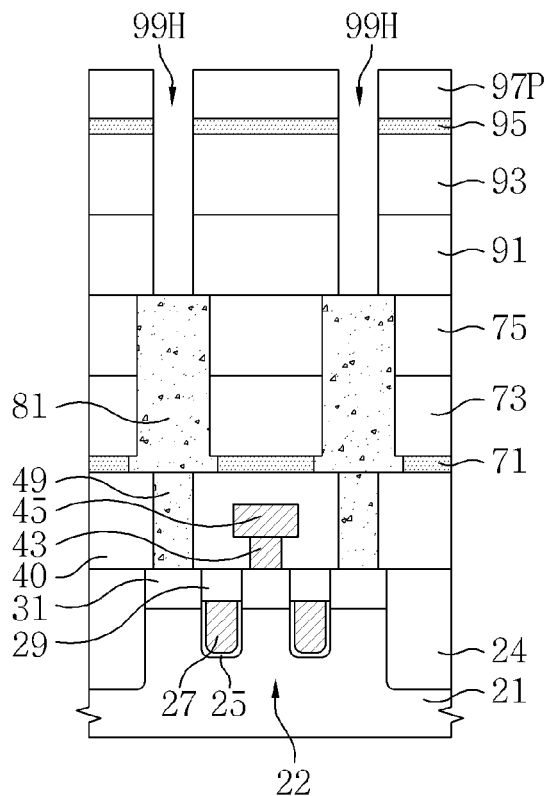

Referring to FIG. 40, the upper mask layer 97 may be patterned and an upper mask pattern 97P may be formed. The upper mask pattern 97P may be used as an etch mask to form second electrode holes 99H penetrating the support layer 95, the fourth mold layer 93, and the third mold layer 91, and exposing the first preliminary electrodes 81. The second electrode holes 99H may be formed to have a narrower width than a width of the first preliminary electrodes 81.

Figure 41:
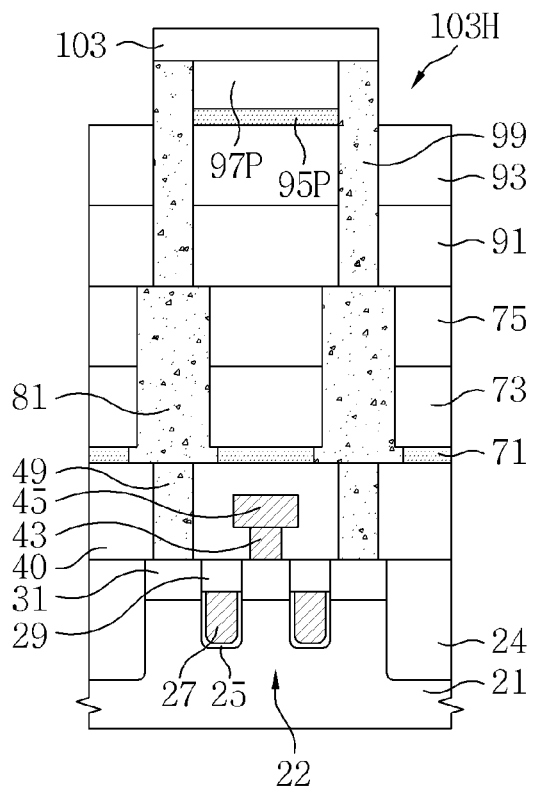

Referring to FIG. 41, second preliminary electrodes 99 may be formed in the second electrode holes 99H. The second preliminary electrodes 99 may be formed of the same material layer as the first preliminary electrodes 81.

A supporter mask pattern 103 may be formed on the upper mask pattern 97P. The supporter mask pattern 103 may be used as an etch mask to pattern the upper mask pattern 97P and the support layer 95 so that a supporter 95P and a supporter opening 103H may be formed. The supporter opening 103H may penetrate the support layer 95. The fourth mold layer 93 may be exposed on a bottom of the supporter opening 103H.

According to an embodiment, the second preliminary electrodes 99 may be omitted.

Figure 42:
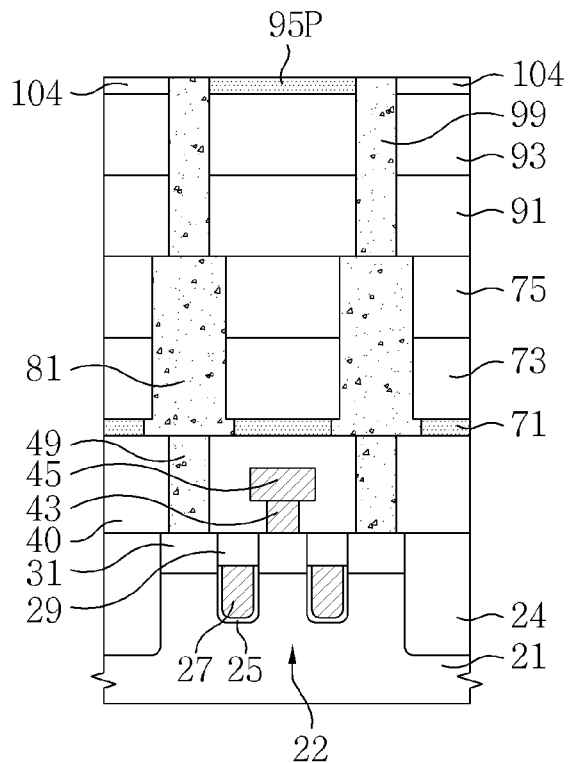

Referring to FIG. 42, the supporter mask pattern 103 may be removed, and the fourth mold layer 93, the second preliminary electrodes 99 and the upper mask pattern 97P may be exposed. A gap fill insulating layer 104 may be formed on an entire top surface of the semiconductor substrate 21. The gap fill insulating layer 104 and the upper mask pattern 97P may be planarized, and top surfaces of the second preliminary electrodes 99 and the supporter 95P may be exposed. The gap fill insulating layer 104 may be maintained in the supporter opening 103H.

Figure 43A:
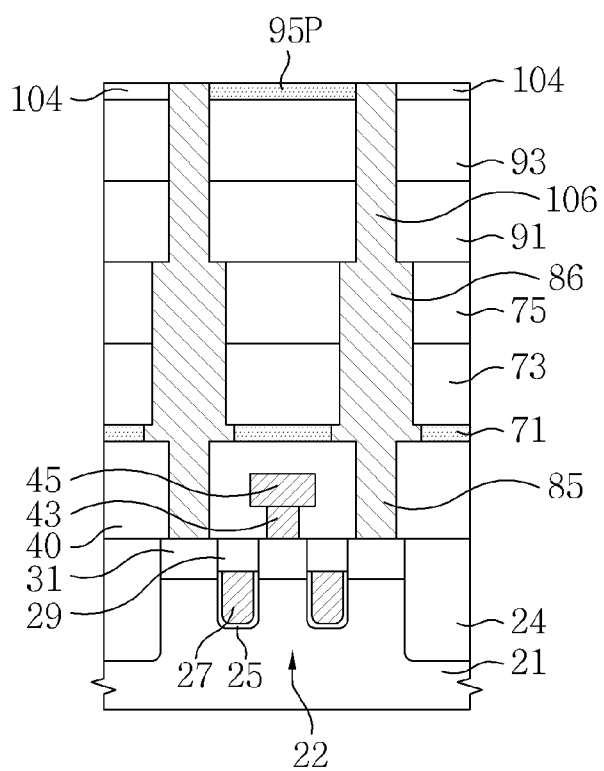

Referring to FIG. 43A, the second preliminary electrodes 99, the preliminary electrodes 81 and the preliminary plugs 49 may be removed, and buried contact plugs 85, first lower electrodes 86 and second lower electrodes 106 may be formed. The buried contact plugs 85, the first lower electrodes 86 and the second lower electrodes 106 may be formed of the same material layer. The second lower electrodes 106 may be formed to have a narrower width than widths of the first lower electrodes 86. According to an embodiment, sidewalls of the second lower electrodes 106 may be formed to be misaligned with sidewalls of the first lower electrodes 86.

Figure 43B:
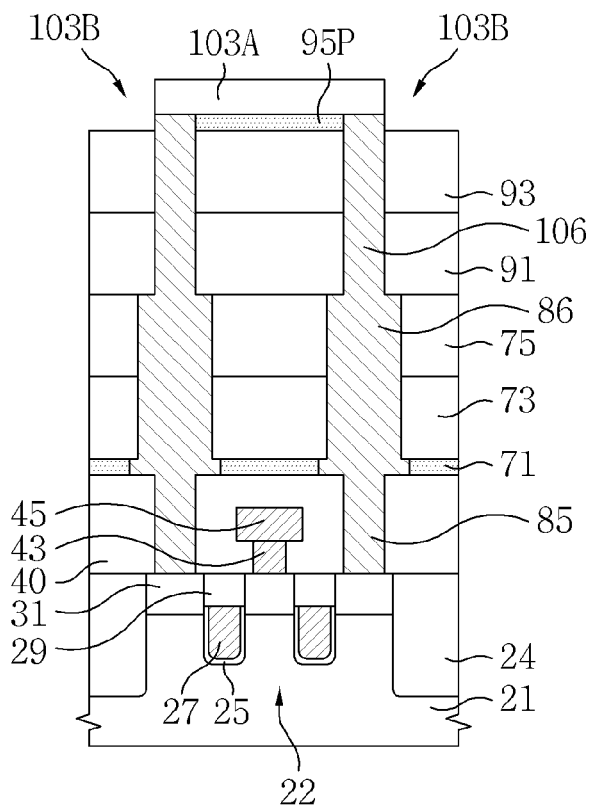

Referring to FIG. 43B, when the second preliminary electrodes 99 are omitted, after the second lower electrodes 106 are formed, the supporter 95P and a supporter opening 103B may be formed. A supporter mask pattern 103A may be applied to the formation of the supporter 95P and the supporter opening 103B.

Figure 44:
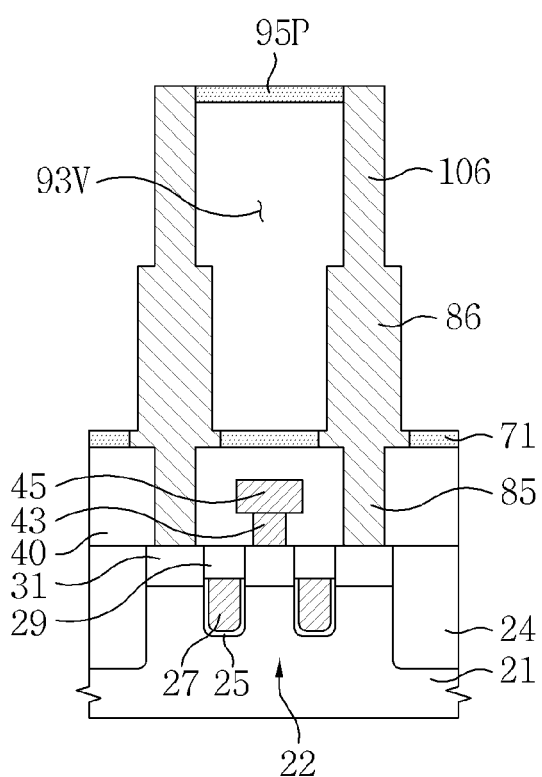

Referring to FIG. 44, the gap fill insulating layer 104, the fourth mold layer 93, the third mold layer 91, the second mold layer 75 and the first mold layer 73 may be removed, and the first lower electrodes 86 and the second lower electrodes 106 may be exposed. The supporter 95P may contact sidewalls of the second lower electrodes 106. An empty space 93V may be formed between the supporter 95P and the second etch stop layer 71.

Figure 45A:
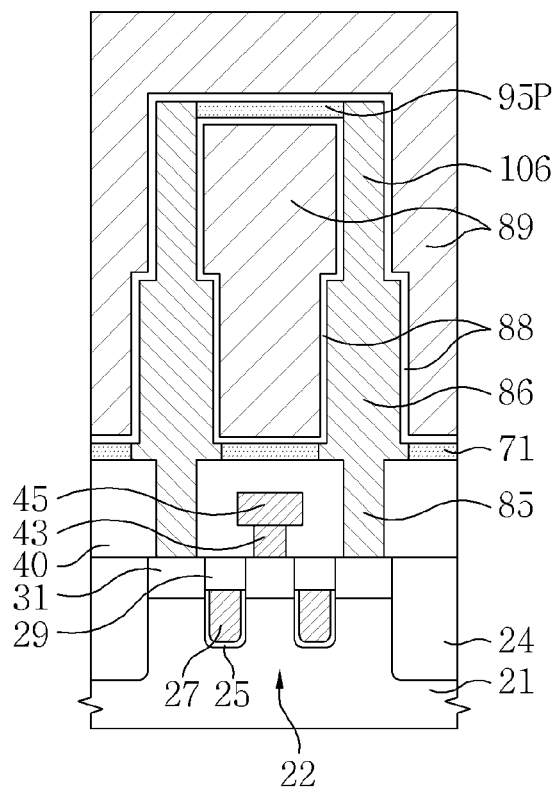

Referring to FIG. 45A, a capacitor dielectric layer 88 and an upper electrode 89 may be sequentially formed on the first lower electrodes 86 and the second lower electrodes 106.

Figure 45B:
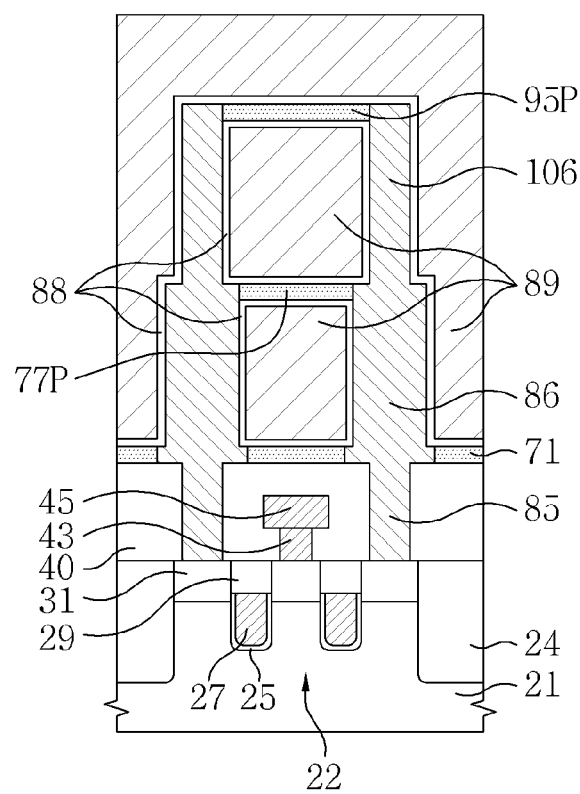

Referring to FIG. 45B, a first supporter 77P may be formed between the first lower electrodes 86. A second supporter 95P may be formed between the second lower electrodes 106.

Figure 45C:
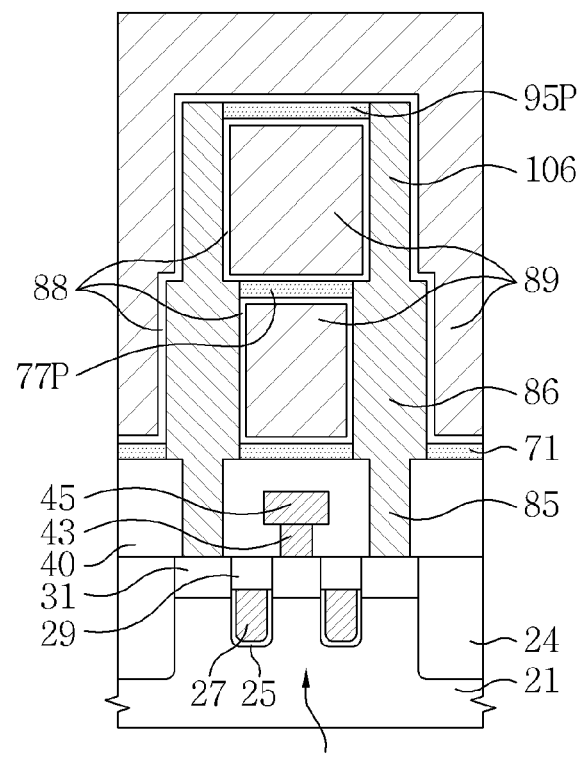

Referring to FIG. 45C, the undercut regions (73U of FIG. 37) may be omitted.

Figure 45D:
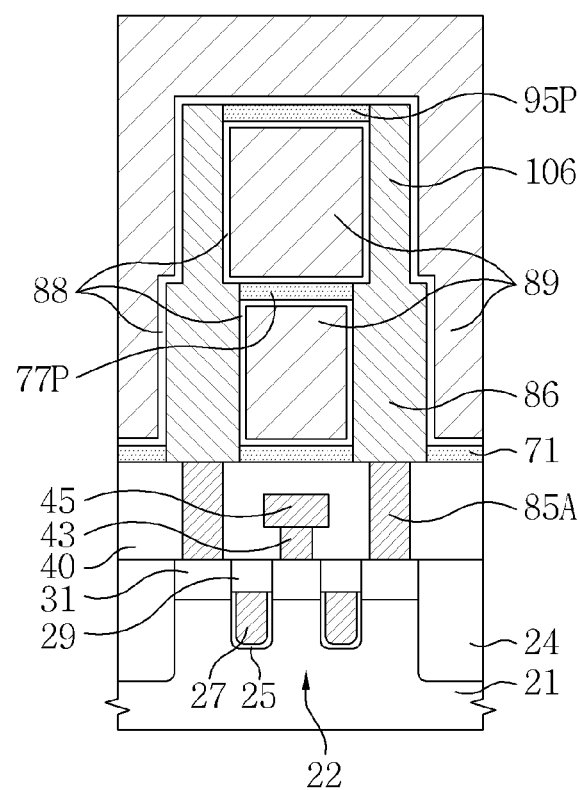

Referring to FIG. 45D, buried contact plugs 85A may be formed prior to the first lower electrodes 86. According to an embodiment, the buried contact plugs 85A may be formed of a different material layer from the first lower electrodes 86. The buried contact plugs 85A may be formed of a metal, metal silicide, polysilicon or a combination thereof.

Figure 46:
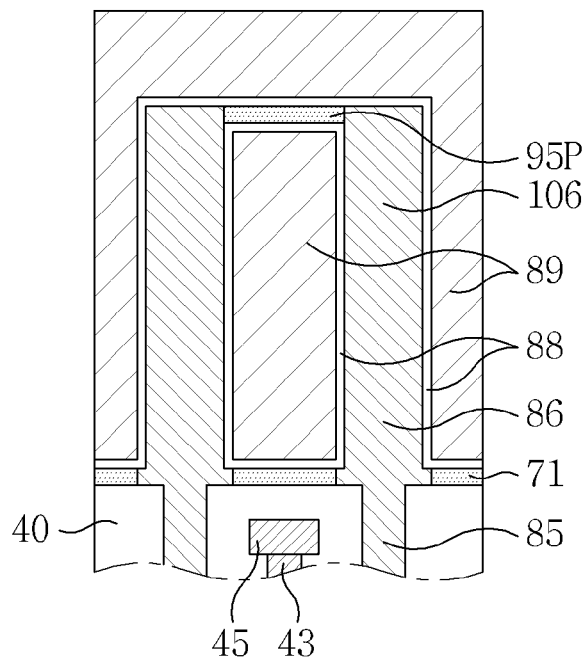

Referring to FIG. 46, the first lower electrodes 86 may be formed to have the same width as widths of the second lower electrodes 106.

Figure 47:
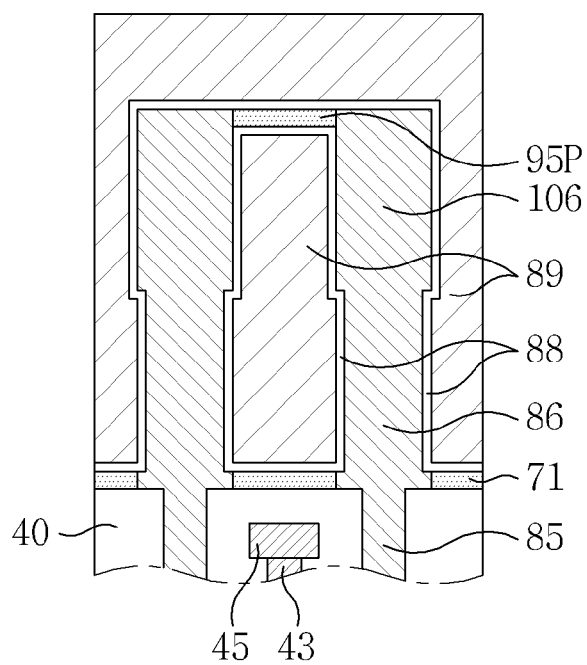

Referring to FIG. 47, the second lower electrodes 106 may be formed to have a greater width than widths of the first lower electrodes 86.

Figure 48:
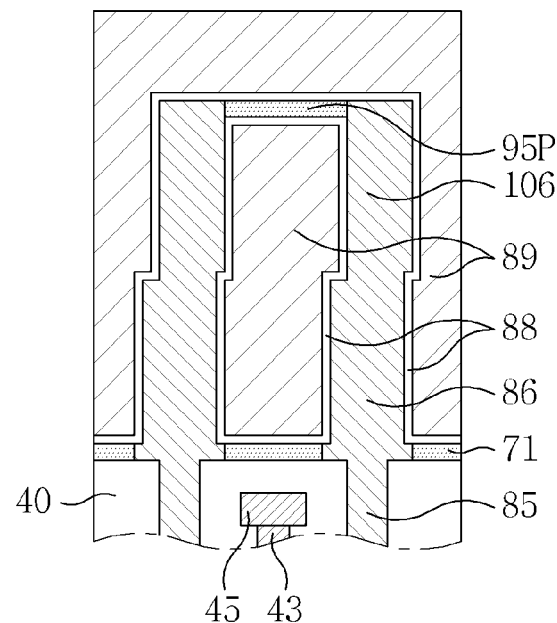

Referring to FIG. 48, the first lower electrodes 86 may be formed to be misaligned with the second lower electrodes 106.

According to an embodiment of the inventive concept, thermal deformation of the buried contact plugs 85 and the first lower electrodes 86 may be prevented. The bonding state between the second lower electrodes 106 and the supporter 95P may be significantly improved over the conventional art.

FIGS. 49 to 52 are cross-sectional views illustrating a method of forming a semiconductor device and devices related to the semiconductor device according to an embodiment of the inventive concept.

Figure 49:
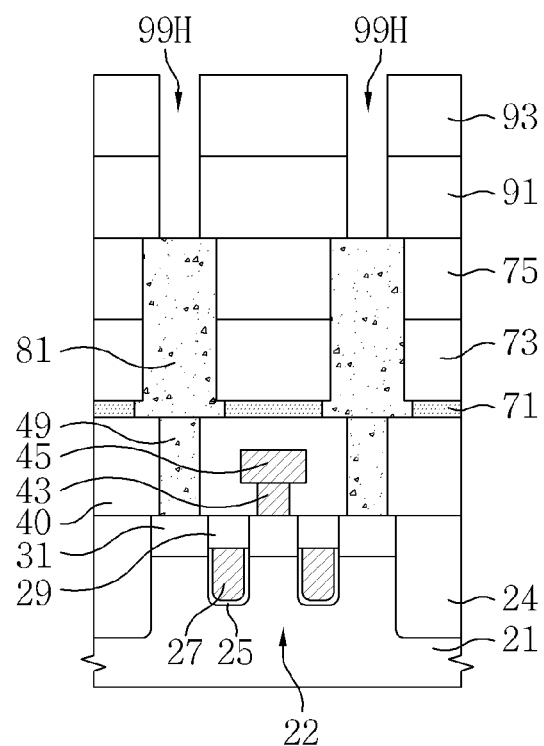
FIGS. 49 to 52 are cross-sectional views illustrating a method of forming a semiconductor device and devices related to the semiconductor device according to an embodiment of the inventive concept.

Referring to FIG. 49, a first active region 22, an isolation layer 24, a cell gate dielectric layer 25, a cell gate electrode 27, a cell gate capping pattern 29, cell source/drain regions 31, an interlayer insulating layer 40, a bit plug 43, a bit line 45, preliminary plugs 49, a second etch stop layer 71, a first mold layer 73, a second mold layer 75 and first preliminary electrodes 81 may be formed on a semiconductor substrate 21.

A third mold layer 91 and a fourth mold layer 93 may be sequentially formed on the second mold layer 75. Second electrode holes 99H penetrating the fourth mold layer 93 and the third mold layer 91, and exposing the first preliminary electrodes 81 may be formed.

Figure 50:
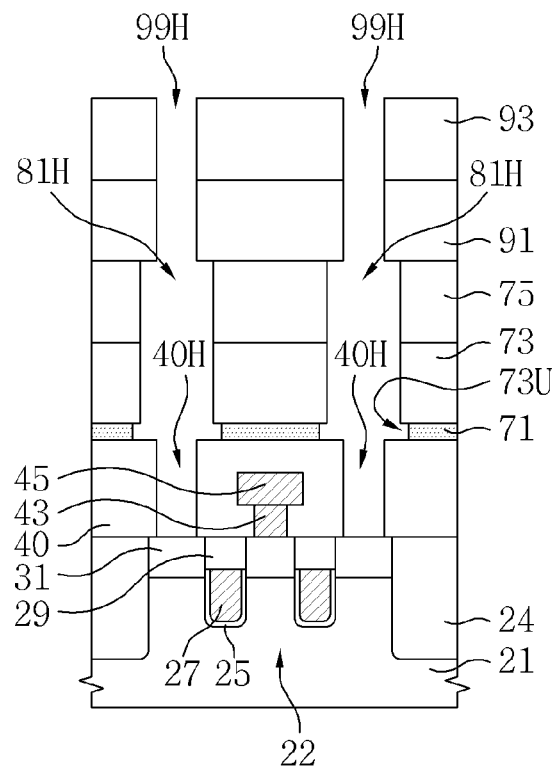

Referring to FIG. 50, the first preliminary electrodes 81 and the preliminary plugs 49 may be removed, and first electrode holes 81H and contact holes 40H may be exposed. The second electrode holes 99H, the first electrode holes 81H and the contact holes 40H may communicate with each other.

Figure 51:
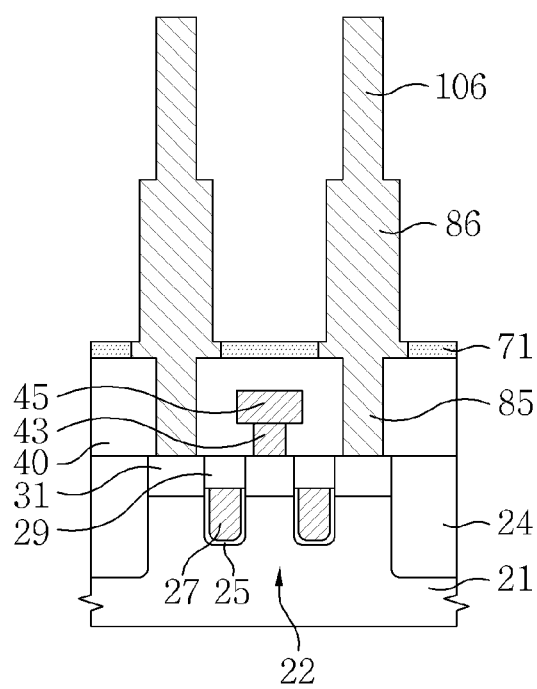

Referring to FIG. 51, buried contact plugs 85, first lower electrodes 86 and second lower electrodes 106 may be formed in the contact holes 40H, the first electrode holes 81H and the second electrode holes 99H. The fourth mold layer 93, the third mold layer 91, the second mold layer 75 and the first mold layer 73 may be removed, and the first lower electrodes 86 and the second lower electrodes 106 may be exposed.

Figure 52:
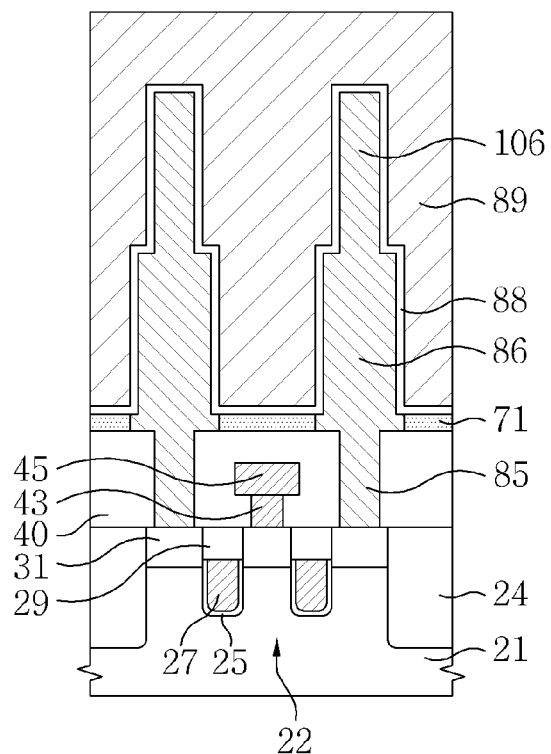

Referring to FIG. 52, a capacitor dielectric layer 88 and an upper electrode may be sequentially formed on the first lower electrodes 86 and the second lower electrodes 106.

Figure 53:
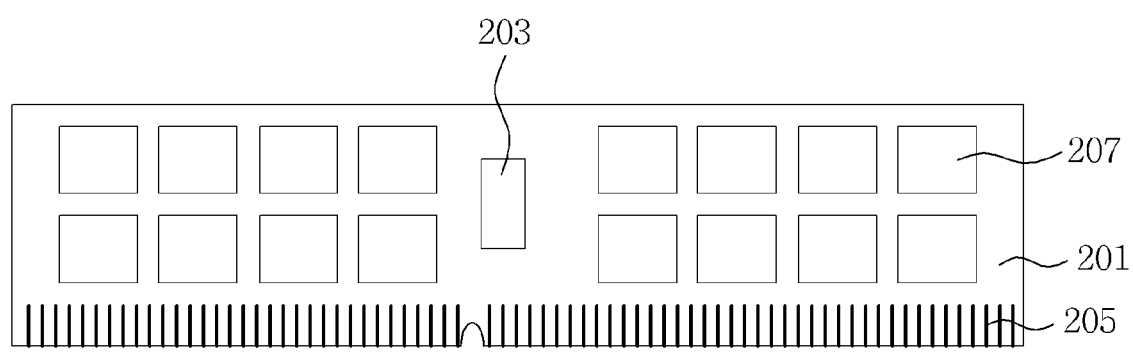
FIG. 53 is a layout diagram illustrating a semiconductor module according to an embodiment of the inventive concept.

FIG. 53 is a layout diagram illustrating a semiconductor module according to an embodiment of the inventive concept.

Referring to FIG. 53, a semiconductor module may include a module substrate 201, a plurality of semiconductor packages 207 and a control chip package 203. Input/output terminals 205 may be formed in the module substrate 201. At least one of the semiconductor packages 207 and the control chip package 203 may have the same or similar configuration as those described with reference to FIGS. 1 to 52. For example, the buried contact plugs (63 of FIGS. 11A and 85 of FIG. 45) may be formed in the semiconductor packages 207 and/or the control chip package 203, and the bit line (45 of FIG. 45) may be electrically connected to the input/output terminals 205 via a bond finger formed in the module substrate 201.

The semiconductor packages 207 and the control chip package 203 may be mounted on the module substrate 201. The semiconductor packages 207 and the control chip package 203 may be electrically connected to the input/output terminals 205 in a serial/parallel manner.

According to an embodiment, the control chip package 203 may be omitted. The semiconductor packages 207 may include a volatile memory chip such as a dynamic random access memory (DRAM) and a static random access memory (SRAM), a non-volatile memory chip such as a flash memory, a phase change memory, a magnetic random access memory (MRAM), and a resistive random access memory (RRAM) or a combination thereof. In this case, the semiconductor module according to a seventh embodiment may be a memory module.

The semiconductor module according to an embodiment may significantly improve electrical properties over the conventional art due to the buried contact plugs (63 of FIGS. 11A and 85 of FIG. 45).

Figure 54:
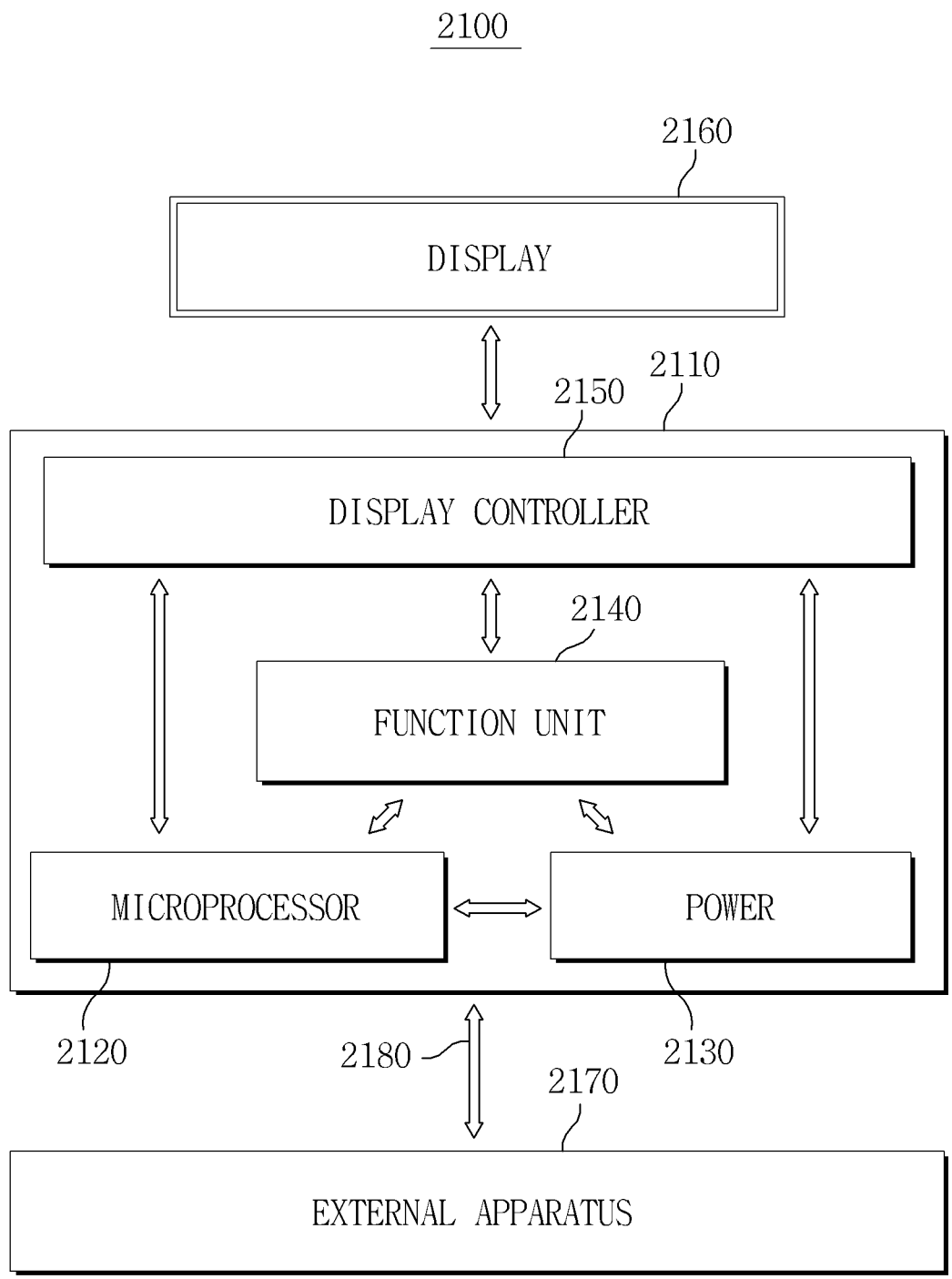
FIG. 54 is a system block diagram illustrating an electronic system according to an embodiment of the inventive concept.

FIG. 54 is a system block diagram illustrating an electric system according to an embodiment of the inventive concept.

Referring to FIG. 54, a semiconductor device the same or similar as that the semiconductor devices described with reference to FIGS. 1 to 52 may be applied to an electronic system 2100. The electronic system 2100 may include a body 2110, a microprocessor unit 2120, a power unit 2130, a functional unit 2140 and a display controller unit 2150. The body 2110 may be a mother board formed of a printed circuit board (PCB). The microprocessor unit 2120, the power unit 2130, the functional unit 2140 and the display controller unit 2150 may be mounted on the body 2110. A display unit 2160 may be arranged inside or outside the body 2110. For example, the display unit 2160 may be arranged in or outside the body 2110 and display an image processed by the display controller unit 2150.

The power unit 2130 may be supplied with a predetermined voltage from an external battery (not shown) and divide the received voltage to a required voltage level, and may supply the divided voltages to the microprocessor unit 2120, the functional unit 2140, or the display controller unit 2150. The microprocessor unit 2120 may receive a voltage from the power unit 2130 and control the functional unit 2140 and the display unit 2160. The functional unit 2140 may perform various functions of the electronic system 2100. For example, when the electronic system 2100 is a cellular phone, the functional unit 2140 may include many components that can perform mobile phone functions including outputting an image to the display unit 2160 and outputting a voice to a speaker, by dialing or communication with an external apparatus 2170, and when a camera is mounted, the system may function as a camera image processor.

According to an embodiment, when the electronic system 2100 is connected to a memory card for capacity expansion, the functional unit 2140 may be a memory card controller. The functional unit 2140 may transmit or receive a signal to or from the external apparatus 2170 via a wired or wireless communication unit 2180. According to an embodiment, when the electronic system 2100 requires a universal serial bus (USB) for function expansion, the functional unit 2140 may function as an interface controller.

A semiconductor device the same or similar as the semiconductor devices described with reference to FIGS. 1 to 52 may be applied to at least one of the microprocessor unit 2120 and the functional unit 2140. For example, the microprocessor unit 2120 or the functional unit 2140 may include the buried contact plugs (63 of FIGS. 11A and 85 of FIG. 45). The electric system 2100 having the buried contact plugs (63 of FIGS. 11A and 85 of FIG. 45) may exhibit significantly improved electrical properties over the conventional art.

According to the embodiments of the inventive concept, after a preliminary plug is formed, various thermal processes are performed, and after the preliminary plug is removed, a buried contact plug is formed. Accordingly, thermal deformation of the preliminary plug may be prevented. The buried contact plug may be formed of a noble metal. The buried contact plug formed of a noble metal can exhibit excellent current drivability. Further, after a preliminary electrode is formed on a preliminary plug, a patterning process for forming a supporter is performed, and after the preliminary electrode is removed, a buried contact plug and a lower electrode can be formed. While the patterning process for forming the supporter is performed, damage to the lower electrode can be prevented. Further, the lower electrode can be formed of a noble metal. A high-K dielectric layer having low band gap energy can be formed on the lower electrode formed of the noble metal. A capacitor employing the lower electrode formed of the noble metal and the high-K dielectric layer can significantly improve characteristics over the conventional art. As a consequence, the buried contact plug and the lower electrode having excellent electrical properties can be implemented.

The foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device comprising:
   a substrate including first, second, and third source/drain regions;
   a first conductive plug in contact with the first source/drain region, wherein the first conductive plug has a first width and a first height and includes a first material;
   an interlayer insulating layer shaped and dimensioned to cover the first conductive plug and the substrate;
   a second conductive plug shaped and dimensioned to vertically penetrate the interlayer insulating layer and to contact the second source/drain region, wherein the second conductive plug has a second width and a second height and includes a second material;
   an etch stop layer on the interlay insulating layer and the second conductive plug;
   a third conductive plug shaped and dimensioned to vertically penetrate the interlayer insulating layer and to contact the third source/drain region, wherein the third conductive plug has a third width and a third height and includes a third material,
   wherein the second material is formed of a noble metal, a noble metal oxide or a perovskite-based conductive oxide;

a lower electrode formed on the interlayer insulating layer, wherein the lower electrode penetrates the etch stop layer, and wherein the lower electrode and the second conductive plug are integrally formed without an interface therebetween by continuously depositing the second material;

a capacitor dielectric layer formed on the lower electrode;

an upper electrode formed on the capacitor dielectric layer; and a supporter in direct contact with a sidewall of the lower electrode, wherein the capacitor dielectric layer is in direct contact with a top surface of the supporter and a bottom surface of the supporter.

2. The device of claim 1, wherein the first material includes silicon.

3. The device of claim 1, wherein the second material includes Pt, Ru, Ir, PtO, $RuO_2$, $IrO_2$, $SrRuO_3$, $BaRuO_3$, $CaRuO_3$, $(Ba,Sr)RuO_3$, or $La(Sr,Co)O_3$.

4. The device of claim 1, wherein the third material includes copper, aluminum, or tungsten.

5. The device of claim 1, wherein the third width is greater than the second width.

6. The device of claim 1, wherein the lower electrode includes a first lower electrode having a first horizontal thickness, and a second lower electrode having a second horizontal thickness, wherein the first horizontal thickness is different from the second horizontal thickness.

7. The device of claim 1, further comprising a metal interconnection formed on the third conductive plug,
wherein the lower electrode is formed at the same level as the metal interconnection.

8. The device of claim 1, further comprising a gate electrode formed adjacent to the third source/drain regions on the substrate,
wherein the gate electrode includes a lower gate electrode and an upper gate electrode, and the lower gate electrode has the same or substantially the same surface height as the first conductive plug.

9. The device of claim 8, further comprising a first conductive interconnection formed on the first conductive plug,
wherein the first conductive interconnection is formed at the same or substantially the same level as the upper gate electrode.

10. The device of claim 8, wherein the lower gate electrode is formed of polysilicon.

11. The device of claim 1, wherein the second height is greater than the first height, and the third height is greater than the second height.

12. The device of claim 1, further comprising a cell gate electrode formed between the first and second source/drain regions.

13. A semiconductor device comprising:
a substrate including first, second, and third source/drain regions;
a bit plug in contact with the first source/drain region, wherein the bit plug has a first width and a first height and includes a first material;
an interlayer insulating layer shaped and dimensioned to cover the bit plug and the substrate;
a buried contact plug shaped and dimensioned to vertically penetrate the interlayer insulating layer and to contact the second source/drain region, Wherein the buried contact plug has a second width and a second height and includes a second material;
an etch stop layer on the interlayer insulating layer and the buried contact plug;
a peripheral plug shaped and dimensioned to vertically penetrate the interlayer insulating layer and to contact the third source/drain region, wherein the peripheral plug has a third width greater than the second width and a third height and includes a third material;
a lower electrode formed on the interlayer insulating layer, wherein the lower electrode penetrates the etch stop layer, and wherein the lower electrode and the buried contact plug are integrally formed without an interface therebetween by continuously depositing the second material;
a supporter in direct contact with a sidewall of the lower electrode;
a capacitor dielectric layer formed on the lower electrode, wherein the capacitor dielectric layer is in direct contact with a top surface of the supporter and a bottom surface of the supporter; and
an upper electrode formed on the capacitor dielectric layer, wherein the second material includes a noble metal, a noble metal oxide, or a perovskite-based conductive oxide.

14. The device of claim 13, wherein the lower electrode includes a first lower electrode formed on the buried contact plug and a second lower electrode formed on the first lower electrode, wherein the first lower electrode and the second lower electrode have different widths, and wherein the supporter includes a first supporter in contact with the first lower electrode and a second supporter in contact with the second lower electrode.

15. A semiconductor device comprising:
a substrate including first and second source/drain regions;
a bit plug on the first source/drain region;
an interlayer insulating layer to cover the bit plug and the substrate;
a buried contact plug on the second source/drain region, wherein the buried contact plug penetrates the interlayer insulating layer;
an etch stop layer on the interlayer insulating layer and the buried contact plug;
a lower electrode on the buried contact plug, wherein the lower electrode penetrates the etch stop layer,
a capacitor dielectric layer formed on the lower electrode;
an upper electrode formed on the capacitor dielectric layer,
wherein the lower electrode and the buried contact plug are integrally formed without an interface therebetween by continuously depositing a material, and wherein the buried contact plug and the lower electrode include a noble metal, a noble metal oxide, or a perovskite-based conductive oxide; and
a supporter in direct contact with a sidewall of the lower electrode, wherein the capacitor dielectric layer is in direct contact with a top surface of the supporter and a bottom surface of the supporter.

16. The device of claim 15, wherein the buried contact plug and the lower electrode are a single continuous structure.

17. The device of claim 15, wherein the buried contact plug and the lower electrode are a single body structure.

18. The device of claim 15, further comprising:
a peripheral plug to penetrate the interlayer insulating layer,
wherein a top of the peripheral plug is higher than a top of the buried contact plug, and wherein the etch stop layer covers the peripheral plug.

* * * * *